United States Patent
Park et al.

(10) Patent No.: US 11,762,428 B2
(45) Date of Patent: Sep. 19, 2023

(54) ELECTRONIC DEVICE AND METHOD FOR CONTROLLING POWER OF THE SAME

(71) Applicant: SAMSUNG ELECTRONICS CO., LTD., Suwon-si (KR)

(72) Inventors: Jeonggyun Park, Suwon-si (KR); Jangje Park, Suwon-si (KR); Sangpil Lee, Suwon-si (KR); Dongkeun Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/734,383

(22) Filed: May 2, 2022

(65) Prior Publication Data
US 2022/0261045 A1    Aug. 18, 2022

Related U.S. Application Data

(63) Continuation of application No. PCT/KR2021/008889, filed on Jul. 12, 2021.

(30) Foreign Application Priority Data

Jul. 13, 2020    (KR) .......................... 10-2020-0086074

(51) Int. Cl.
*G09G 5/00* (2006.01)
*G06F 1/16* (2006.01)
(Continued)

(52) U.S. Cl.
CPC .......... *G06F 1/1677* (2013.01); *G06F 1/3231* (2013.01); *H03K 17/955* (2013.01);
(Continued)

(58) Field of Classification Search
CPC .... G06F 1/1616; G06F 1/1652; G06F 1/1677; G06F 1/3231; G06F 2200/1636;
(Continued)

(56) References Cited

U.S. PATENT DOCUMENTS

2013/0215041 A1* 8/2013 Kim .................... G06F 1/1694
                                                   345/173
2014/0192927 A1   7/2014 Kim
(Continued)

FOREIGN PATENT DOCUMENTS

JP      2001-223514     8/2001
KR   10-2007-0082308    8/2007
(Continued)

OTHER PUBLICATIONS

International Search Report for PCT/KR2021/008889 dated Oct. 18, 2021, 6 pages.
(Continued)

*Primary Examiner* — Insa Sadio
(74) *Attorney, Agent, or Firm* — Nixon & Vanderhye, P.C.

(57) ABSTRACT

An electronic device including a first housing and a second housing facing each other and combined with each other to be folded or unfolded is disclosed, the electronic device includes: a first grip sensor included in the first housing; a second grip sensor included in the second housing; and a processor, wherein the processor is configured to: determine a folded state or an unfolded state of the electronic device, sense proximity and/or contact of a human body using the second grip sensor and adjust a radiated power of the electronic device and/or a power of the electronic device based on the sensed proximity and/or contact of the human body based on the electronic device being determined to be in the unfolded state, and sense the proximity and/or contact of the human body using the first grip sensor and adjust the radiated power of the electronic device and/or the power of the electronic device based on the sensed proximity and/or contact of the human body based on the electronic device being determined to be in the folded state.

15 Claims, 13 Drawing Sheets

(51) Int. Cl.
 *G06F 1/3231* (2019.01)
 *H03K 17/955* (2006.01)
(52) U.S. Cl.
 CPC ............... *G06F 2200/1636* (2013.01); *H03K 2217/960755* (2013.01)
(58) Field of Classification Search
 CPC ............ H03K 17/955; H03K 17/962; H03K 2217/960755; H04M 1/0245; H04M 1/72454; H04M 2250/12
 See application file for complete search history.

(56) References Cited

U.S. PATENT DOCUMENTS

| | | | |
|---|---|---|---|
| 2017/0169741 A1* | 6/2017 | Li | ........................ G06F 1/1616 |
| 2017/0245377 A1 | 8/2017 | Lee | |
| 2019/0196589 A1 | 6/2019 | Shim et al. | |
| 2020/0125194 A1 | 4/2020 | Jiang et al. | |
| 2020/0136668 A1 | 4/2020 | Chu et al. | |
| 2021/0203191 A1 | 7/2021 | Kim et al. | |

FOREIGN PATENT DOCUMENTS

| | | |
|---|---|---|
| KR | 10-2014-0090423 | 7/2014 |
| KR | 10-2017-0098450 | 8/2017 |
| KR | 10-2018-0101964 | 9/2018 |
| KR | 10-2019-0130750 | 11/2019 |
| KR | 10-2020-0049391 | 5/2020 |

OTHER PUBLICATIONS

Written Opinion of the ISA for PCT/KR2021/008889 dated Oct. 18, 2021, 4 pages.

* cited by examiner

ELECTRONIC DEVICE AND METHOD FOR CONTROLLING POWER OF THE SAME

CROSS-REFERENCE TO RELATED APPLICATIONS

This application is a continuation of International Application No. PCT/KR2021/008889 designating the United States, filed on Jul. 12, 2021, in the Korean Intellectual Property Receiving Office and claiming priority to Korean Patent Application No. 10-2020-0086074, filed on Jul. 13, 2020, in the Korean Intellectual Property Office, the disclosures of which are incorporated by reference herein in their entireties.

BACKGROUND

Field

The disclosure relates to an electronic device and a method for controlling a power of the electronic device using a grip sensor.

Description of Related Art

In various electronic devices, such as smart phone, tablet PC, portable multimedia player (PMP), personal digital assistant (PDA), laptop personal computer (laptop PC), and wearable device, such as wrist watch and head-mounted display (HMD), there is a need for improvement of the specific absorption rate (SAR) in accordance with a physical contact as the research results indicating that electromagnetic waves are harmful to the human body come out.

The specific absorption rate (SAR) is increased in proportion to the power of an electromagnetic field being output from an antenna, and complies with the international standards for the specific absorption rate (SAR) generally through lowering of the radiated power.

SUMMARY

Embodiments of the disclosure provide an electronic device that can control the specific absorption rate (SAR) through sensing of a physical contact using a grip sensor.

According to various example embodiments of the disclosure, an electronic device including a first housing and a second housing facing each other and combined with each other to be folded or unfolded, the electronic device may include: a first grip sensor included in the first housing; a second grip sensor included in the second housing; and a processor, wherein the processor is configured to: determine a closed state or an unfolding state of the electronic device, sense proximity and/or contact of a human body using the second grip sensor and adjust a radiated power of the electronic device and/or a power of the electronic device based on the sensed proximity and/or contact of the human body based on the electronic device being determined to be in the unfolding state, and sense the proximity and/or contact of the human body using the first grip sensor and adjust the radiated power of the electronic device and/or the power of the electronic device based on the sensed proximity and/or contact of the human body based on the electronic device being determined to be in the closed state.

According to various example embodiments of the disclosure, a method for controlling a power of an electronic device including a first housing and a second housing facing each other and combined with each other to be folded or unfolded, the first housing including a first grip sensor, and the second housing including a second grip sensor, the method may include: determining a closed state or an unfolding state of the electronic device; sensing proximity and/or contact of a human body using the second grip sensor and adjusting a radiated power of the electronic device and/or a power of the electronic device based on the sensed proximity and/or contact of the human body based on the electronic device being determined to be in the unfolding state; and sensing the proximity and/or contact of the human body using the first grip sensor and adjusting the radiated power of the electronic device and/or the power of the electronic device based on the sensed proximity and/or contact of the human body based on the electronic device being determined to be in the closed state.

According to various example embodiments, the electronic device including the grip sensor according to various example embodiments of the disclosure, the grip sensor can sense the proximity or contact of the human body with the electronic device without being affected by other components having permittivity of the electronic device even if the foldable housing of the electronic device is changed to the folding or unfolding state.

According to various example embodiments of the electronic device including the grip sensor according to various example embodiments of the disclosure, since the power is controlled through sensing of the proximity or contact of the human body, the specific absorption rate (SAR) can be controlled.

BRIEF DESCRIPTION OF THE DRAWINGS

In relation to explanation of the drawings, the same or similar reference numerals may be used for the same or similar elements. Further, the above and other aspects, features and advantages of certain embodiments of the present disclosure will be more apparent from the following detailed description, taken in conjunction with the accompanying drawings, in which.

DETAILED DESCRIPTION

Hereinafter, various example embodiments of the disclosure may be described with reference to the accompanying drawings.

Figure 1A:
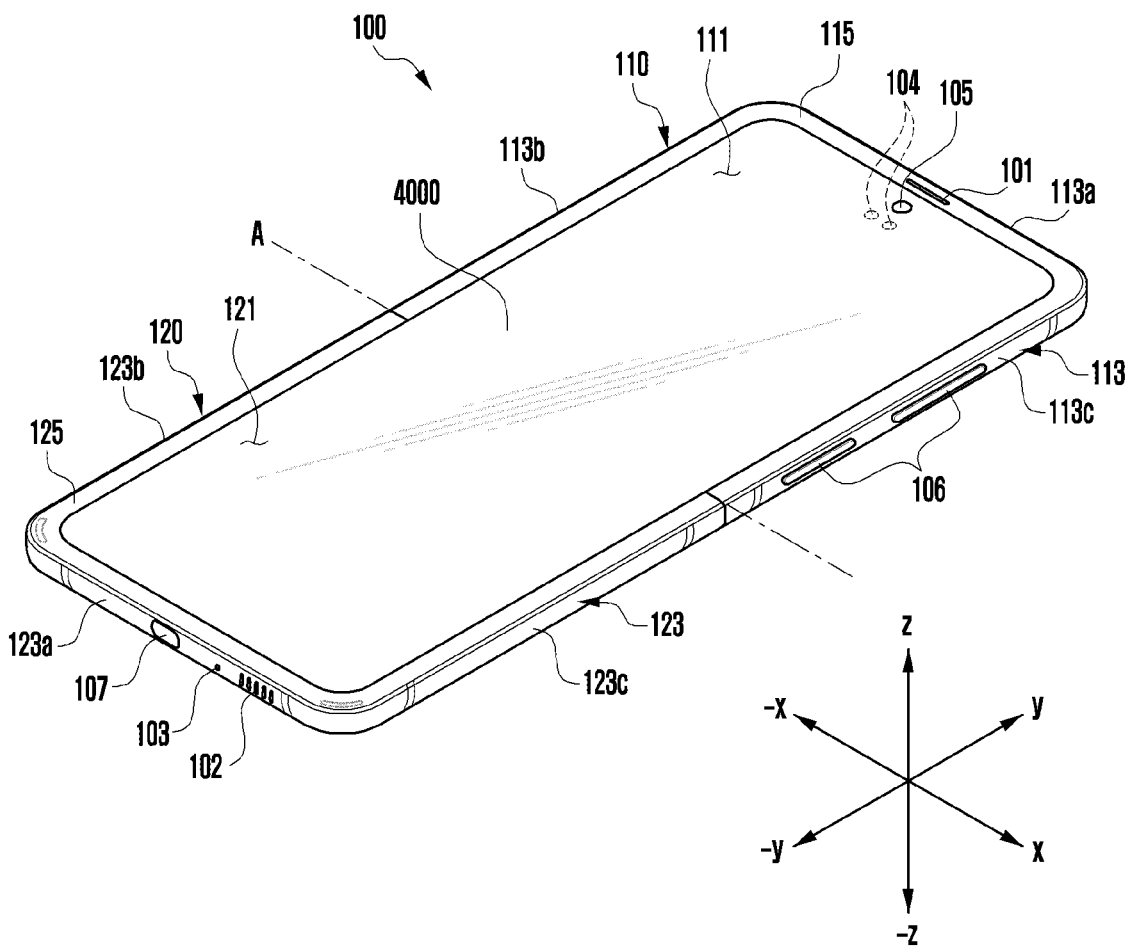
FIG. 1A is a front perspective view of an electronic device illustrating a flat or unfolding state of the electronic device according to various embodiments.
Figure 1B:
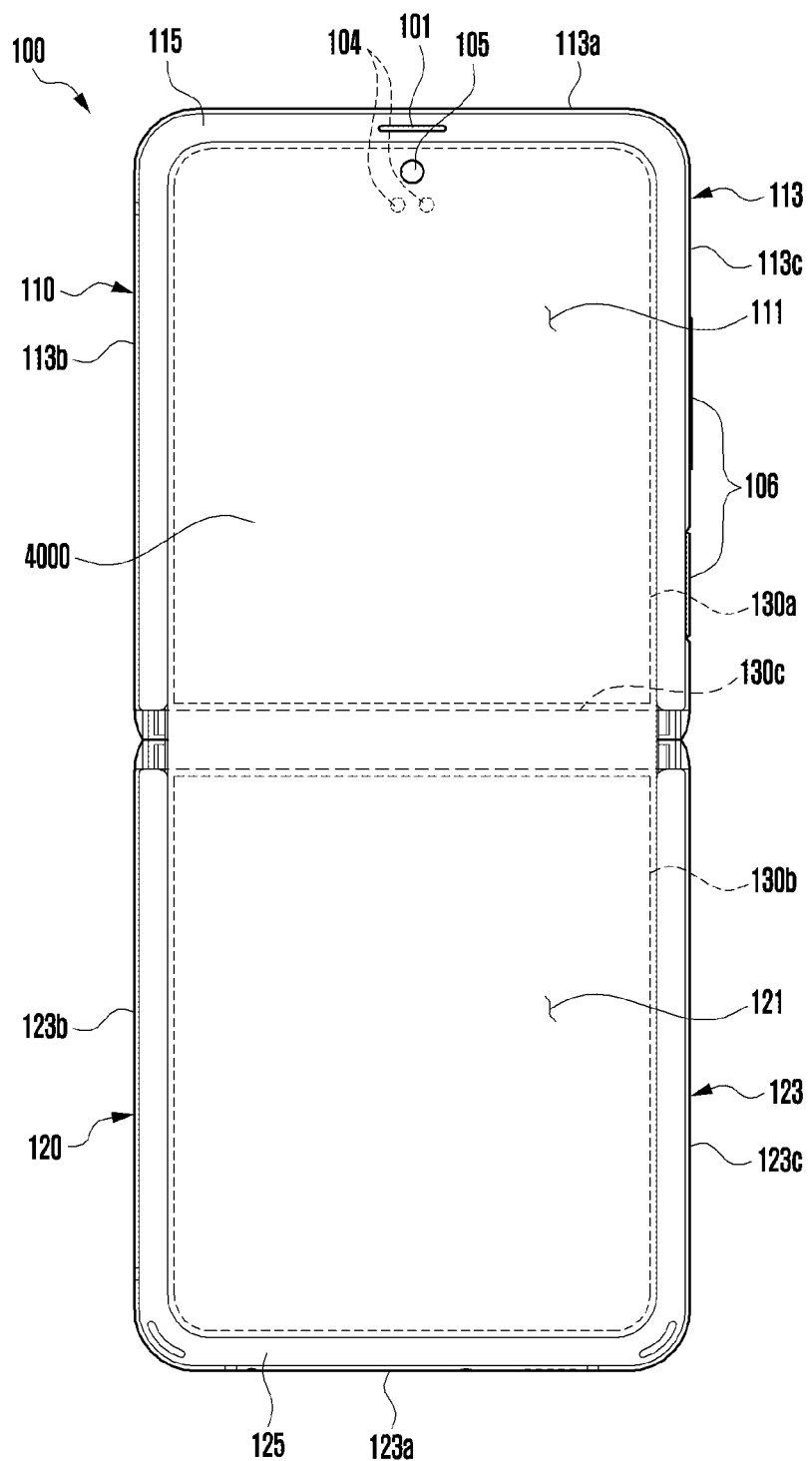
FIG. 1B is a diagram illustrating a front surface of an electronic device in a flat or unfolding state according to various embodiments.
Figure 1C:
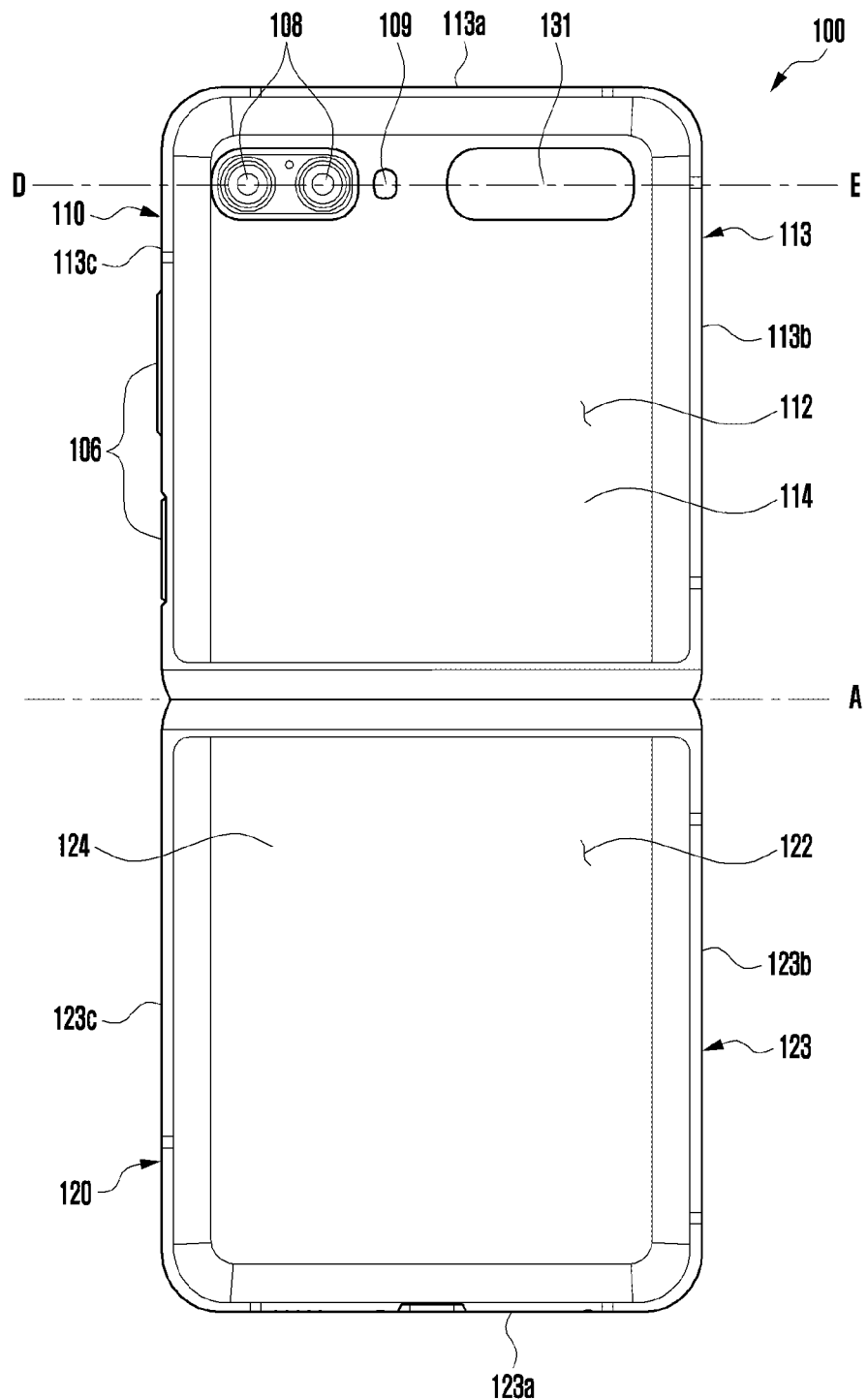
FIG. 1C is a diagram illustrating a rear surface of an electronic device in a flat or unfolding state according to various embodiments.

FIG. 1A is a front perspective view of an electronic device illustrating a flat or unfolding state of the electronic device according to various embodiments. FIG. 1B is a diagram illustrating a front surface of an electronic device in a flat or unfolding state according to various embodiments. FIG. 1C is a diagram illustrating a rear surface of an electronic device in a flat or unfolding state according to various embodiments.

Figure 2A:
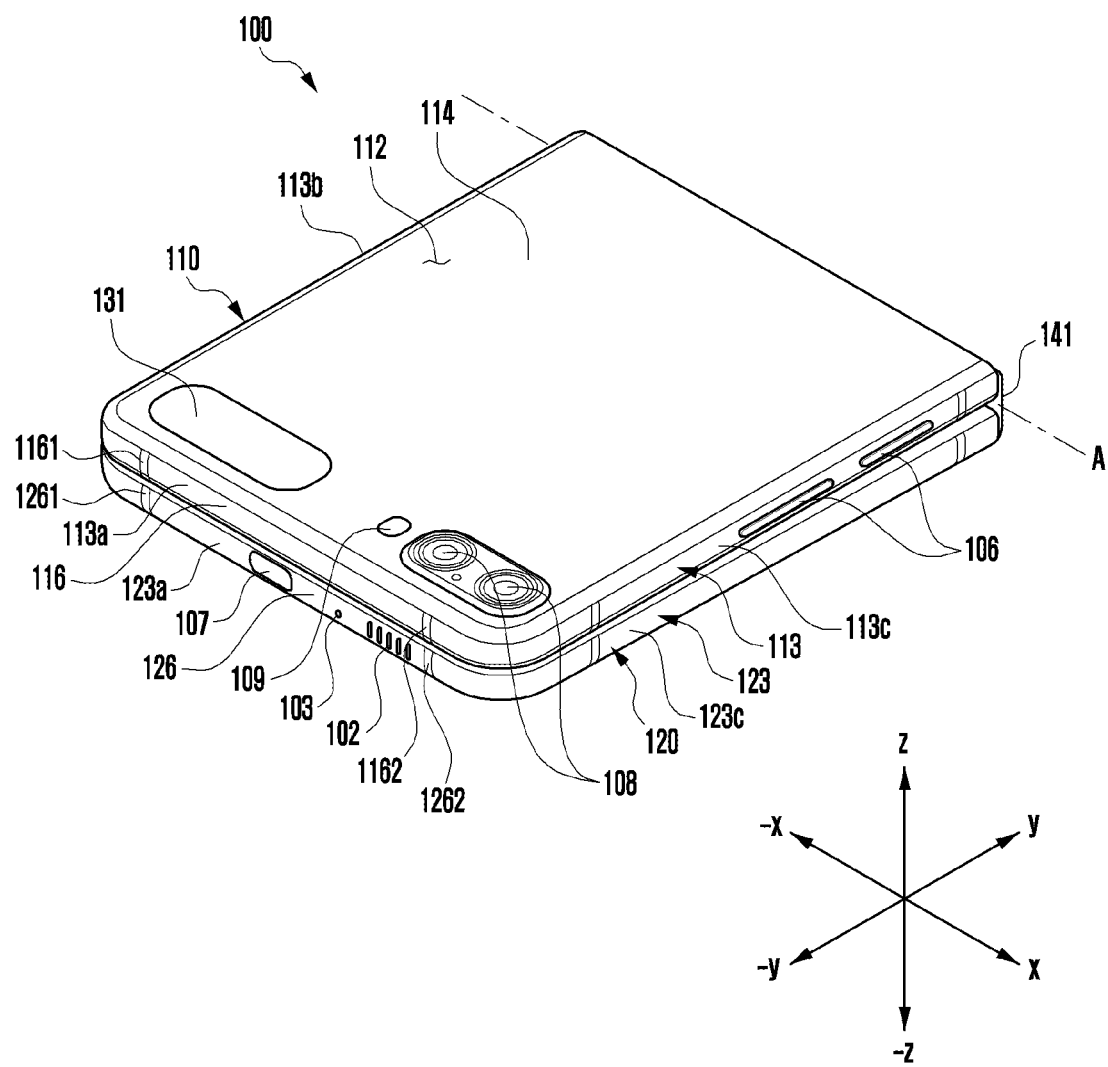
FIG. 2A is a perspective view of an electronic device illustrating a folded state of the electronic device according to various embodiments.
Figure 2B:
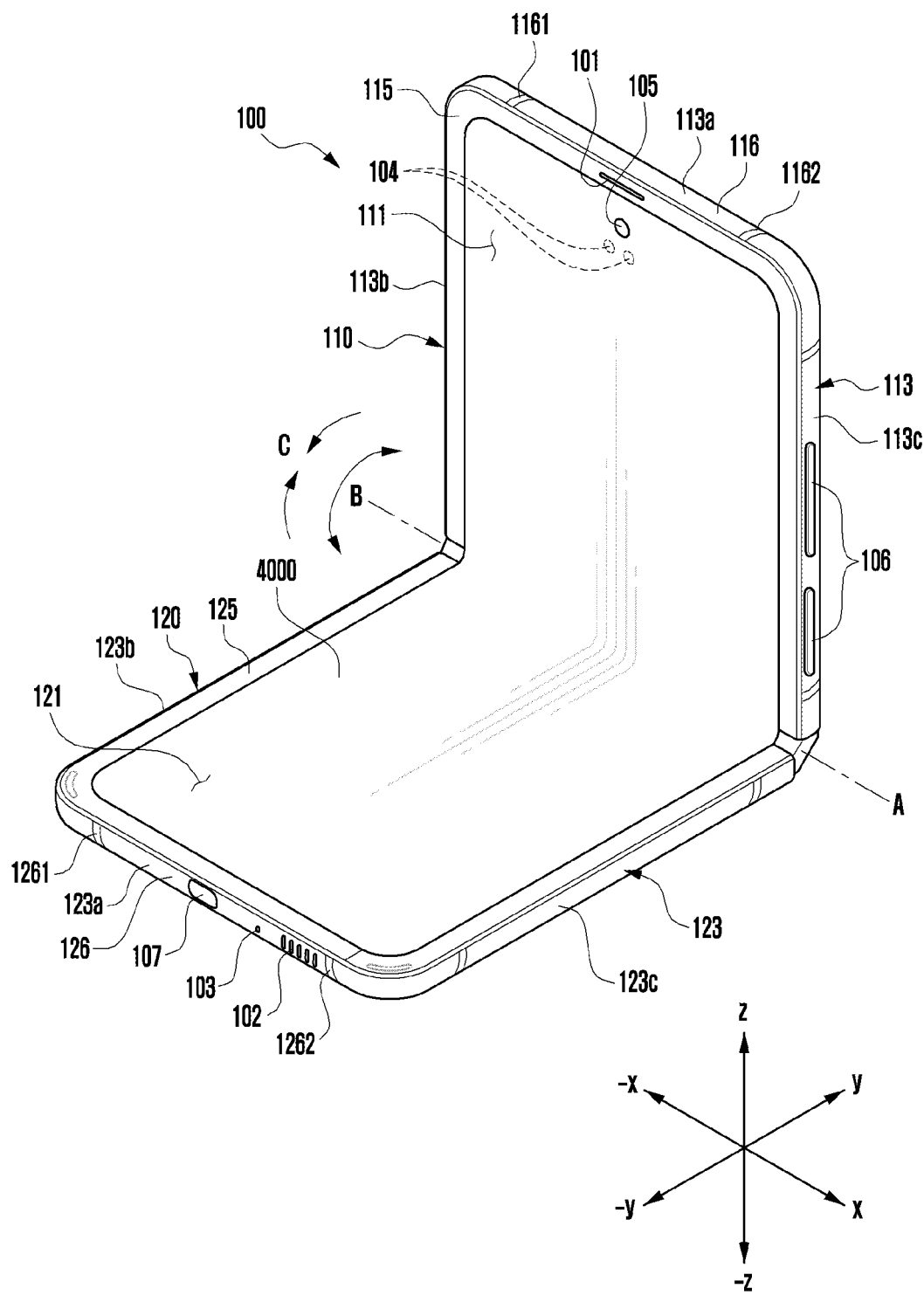
FIG. 2B is a perspective view of an electronic device illustrating an intermediate folding state of the electronic device according to various embodiments.

FIG. 2A is a perspective view of an electronic device illustrating a folded state of the electronic device according to various embodiments. FIG. 2B is a perspective view of an electronic device illustrating an intermediate folding state of the electronic device according to various embodiments.

With reference to FIGS. 1A, 1B, 1C, 2A and 2B (which may be referred to as FIGS. 1A to 2B), an electronic device 100 may include a pair of housings 110 and 120 (e.g., foldable housing) facing each other to be folded based on a hinge module (e.g., hinge module 140 of FIG. 3) and rotatably combined with each other. According to an embodiment, the electronic device 100 may include a flexible display 4000 (e.g., foldable display) disposed in an area formed by the pair of housings 110 and 120. According to an embodiment, the first housing 110 and the second housing 120 may be disposed on both sides around a folding axis (axis A), and may have a substantially symmetric shape about the folding axis (axis A). According to an embodiment, the first housing 110 and the second housing 120 may have different angles or distances between them depending on whether the electronic device 100 is in a flat or unfolding state, a folding state, or an intermediate state. According to various embodiments, the electronic device 100 may include a first display on the first housing 110, and a second display (not illustrated) on the second housing 120.

Figure 3:
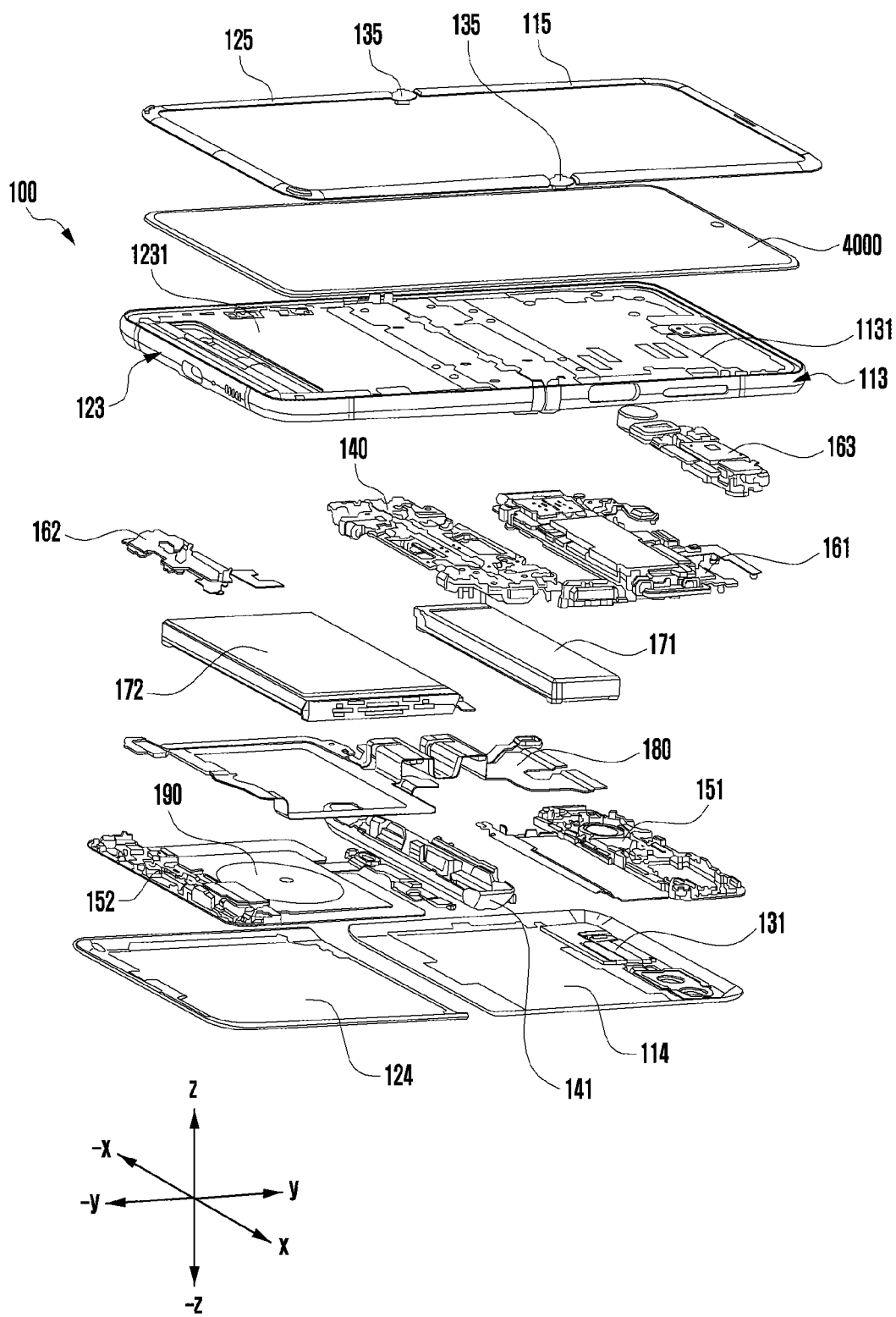
FIG. 3 is an exploded perspective view of an electronic device according to various embodiments.

According to various embodiments, the pair of housings 110 and 120 may include the first housing 110 (e.g., first housing structure) combined with the hinge module (e.g., hinge module 140 of FIG. 3) and the second housing 120 (e.g., second housing structure) combined with the hinge module (e.g., hinge module 140 of FIG. 3). According to an embodiment, the first housing 110, in the unfolding state, may include a first surface 111 directed in a first direction (e.g., front direction) (z-axis direction), and a second surface 112 directed in a second direction (e.g., rear direction) (−z-axis direction) to face the first surface 111. According to an embodiment, the second housing 120, in the unfolding state, may include a third surface 121 directed in the first direction (z-axis direction), and a fourth surface 122 directed in the second direction (−z-axis direction). According to an embodiment, the electronic device 100 may operate in a manner that in the unfolding state, the first surface 111 of the first housing 110 and the third surface 121 of the second housing 120 are directed substantially in the same first direction (z-axis direction), and in the folding state, the first surface 111 and the third surface 121 face each other. According to an embodiment, the electronic device 100 may operate in a manner that in the unfolding state, the second surface 112 of the first housing 110 and the fourth surface 122 of the second housing 120 are directed substantially in the same second direction (−z-axis direction), and in the folding state, the second surface 112 and the fourth surface 122 are directed in the opposite direction to each other. For example, in the folding state, the second surface 112 may be directed in the first direction (z-axis direction), and the fourth surface 122 may be directed in the second direction (−z-axis direction).

According to various embodiments, the first housing 110 may include a first side frame 113 forming an exterior of the electronic device 100 at least partly, and a first rear cover 114 combined with the first side frame 113 and forming at least a part of the second surface 112 of the electronic device 100. According to an embodiment, the first side frame 113 may include a first side surface 113*a*, a second side surface 113*b* extending from one end of the first side surface 113*a*, and a third side surface 113*c* extending from the other end of the first side surface 113*a*. According to an embodiment, the first side frame 113 may be formed in the shape of a quadrangle (square or rectangle) through the first side surface 113*a*, the second side surface 113*b*, and the third side surface 113*c*.

According to various embodiments, the second housing 120 may include a second side frame 123 forming an exterior of the electronic device 100 at least partly, and a second rear cover 124 combined with the second side frame 123 and forming at least a part of the fourth surface 122 of the electronic device 100. According to an embodiment, the second side frame 123 may include a fourth side surface 123*a*, a fifth side surface 123*b* extending from one end of the fourth side surface 123*a*, and a sixth side surface 123*c* extending from the other end of the fourth side surface 123*a*. According to an embodiment, the second side frame 123 may be formed in the shape of a quadrangle through the fourth side surface 123*a*, the fifth side surface 123*b*, and the sixth side surface 123*c*.

According to various embodiments, the pair of housings 110 and 120 are not limited to the illustrated shape and combination, but may be implemented by other shapes or a component combination and/or coupling. For example, in an embodiment, the first side frame 113 may be formed in a body with the first rear cover 114, and the second side frame 123 may be formed in a body with the second rear cover 124.

According to various embodiments, in the unfolding state of the electronic device 100, the second side surface 113*b* of the first side frame 113 and the fifth side surface 123*b* of the second side frame 123 may be connected together without any gap. According to an embodiment, in the unfolding state of the electronic device 100, the third side surface 113*c* of the first side frame 113 and the sixth side surface 123*c* of the second side frame 123 may be connected together without any gap. According to an embodiment, the electronic device 100, in the unfolding state, may be configured so that the total length of the second side surface 113*b* and the fifth side surface 123*b* is longer than the length of the first side surface 113*a* and/or the fourth side surface 123*a*. Further, the electronic device 100 may be configured so that the total length of the third side surface 113*c* and the sixth side surface 123*c* is longer than the length of the first side surface 113*a* and/or the fourth side surface 123*a*.

According to various embodiments, the first side frame 113 and/or the second side frame 123 may be formed of a metal, or may further include a polymer injected into the metal. According to an embodiment, the first side frame 113 and/or the second side frame 123 may include at least one conductive part 116 and/or 126 electrically segmented through at least one segment part 1161, 1162, and/or 1261, 1262 formed of a polymer. In this case, the at least one conductive part may be electrically connected to a wireless communication circuit included in the electronic device 100, and may be used as an antenna operating in at least one designated band (e.g., legacy band).

According to various embodiments, the first rear cover 114 and/or the second rear cover 124 may be formed by a combination of at least one or two of, for example, coated or colored glass, ceramic, polymer, or metal (e.g., aluminum, stainless steel (STS), or magnesium).

According to various embodiments, the flexible display 4000 may be disposed to extend from the first surface 111 of the first housing 110 to at least a part of the third surface 121 of the second housing 120 across the hinge module (e.g., hinge module 140 of FIG. 3). For example, the flexible display 4000 may include a first flat part 130a substantially corresponding to the first surface 111, a second flat part 130b corresponding to the second surface 121, and a bendable part 130c connecting the first flat part 130a and the second flat part 130b to each other, and corresponding to the hinge module (e.g., hinge module 140 of FIG. 3). According to an embodiment, the electronic device 100 may include a first protection cover 115 (e.g., first protection frame or first decoration member) combined along an edge of the first housing 110. According to an embodiment, the electronic device 100 may include a second protection cover 125 (e.g., second protection frame or second decoration member) combined along an edge of the second housing 120. According to an embodiment, the first protection cover 115 and/or the second protection cover 125 may be formed of a metal or polymer material. According to an embodiment, the first protection cover 115 and/or the second protection cover 125 may be used as the decoration member. According to an embodiment, in the flexible display 4000, the edge of the first flat part 130a may be located to be interposed between the first housing 110 and the first protection cover 115. According to an embodiment, in the flexible display 4000, the edge of the second flat part 130b may be located to be interposed between the second housing 120 and the second protection cover 125. According to an embodiment, the flexible display 4000 may be located so that the edge of the flexible display 4000 corresponding to a protection cap (e.g., protection cap 135 of FIG. 3) is protected through the protection cap disposed in an area corresponding to the hinge module (e.g., hinge module 140 of FIG. 3). Accordingly, the edge of the flexible display 4000 can substantially be protected against an outside. According to an embodiment, the electronic device 100 may include a hinge housing 141 (e.g., hinge cover) supporting the hinge module (e.g., hinge module 140 of FIG. 3), and disposed to be exposed to the outside when the electronic device 100 is in the folding state, and to enter into a first space and a second space so as not to be seen from the outside when the electronic device 100 is in the unfolding state.

According to various embodiments, the electronic device 100 may include a sub-display 131 disposed separately from the flexible display 4000. According to an embodiment, the sub-display 131 may be disposed to be visually exposed at least partly on the second surface 112 of the first housing 110, and in the folding state, it may display state information of the electronic device 100 in replacement of the display function of the flexible display 4000. According to an embodiment, the sub-display 131 may be disposed to be seen from the outside through at least a partial area of the first rear cover 114. In an embodiment, the sub-display 131 may be disposed on the fourth surface 124 of the second housing 120. In such a case, the sub-display 131 may be disposed to be seen from the outside through the at least a partial area of the second rear cover 124.

According to various embodiments, the electronic device 100 may include at least one of an input device 103 (e.g., microphone), sound output devices 101 and 102, a sensor module 104, camera devices 105 and 108, a key input device 106, or a connector port 107. In the illustrated embodiment, the input device 103 (e.g., microphone), the sound output devices 101 and 102, the sensor module 104, the camera devices 105 and 108, the key input device 106, or the connector port 107 may refer to a hole or a shape formed on the first housing 110 or the second housing 120, but may be defined to include a substantial electronic component (input device, sound output device, sensor module, or camera device) which is disposed inside the electronic device 100 and operates through the hole or the shape.

According to various embodiments, the input device 103 may include at least one microphone 103 disposed on the second housing 120. In an embodiment, the input device 103 may include a plurality of microphones 103 disposed to sense the direction of a sound. In an embodiment, the plurality of microphones 103 may be disposed at appropriate locations on the first housing 110 and/or the second housing 120. According to an embodiment, the sound output devices 101 and 102 may include speakers 101 and 102. According to an embodiment, the speakers 101 and 102 may include a call receiver 101 disposed on the first housing 110, and the speaker 102 disposed on the second housing 120. In an embodiment, the input device 103, the sound output devices 101 and 102, and the connector port 107 may be disposed in spaces provided in the first housing 110 and/or the second housing of the electronic device 100, and may be exposed to an external environment through at least one hole formed on the first housing 110 and/or the second housing 120. According to an embodiment, the at least one connector port 107 may be used to transmit and receive a power and/or data to and from an external electronic device. In an embodiment, the at least one connector port (e.g., ear jack hole) may accommodate a connector (e.g., ear-jack) for transmitting and receiving an audio signal to and from the external electronic device. In an embodiment, the holes formed on the first housing 110 and/or the second housing 120 may be commonly used for the input device 103 and the sound output devices 101 and 102. In an embodiment, the sound output devices 101 and 102 may include speakers (e.g., piezo-electric speakers) operating in a state where the holes formed on the first housing 110 and/or the second housing 120 are excluded.

According to various embodiments, the sensor module 104 may generate an electrical signal or a data value corresponding to an internal operation state of the electronic device 100 or an external environment state. For example, the sensor module 104 may sense an external environment through the first surface 111 of the first housing 110. In an embodiment, the electronic device 100 may further include at least one sensor module disposed to sense the external environment through the second surface 112 of the first housing 110. According to an embodiment, the sensor module 104 (e.g., illuminance sensor) may be disposed under the flexible display 4000 to sense the external environment through the flexible display 4000. According to an embodiment, the sensor module 104 may include at least one of a gesture sensor, a gyro sensor, a barometric pressure sensor, a magnetic sensor, an acceleration sensor, a grip sensor, a color sensor, an infrared (IR) sensor, a biosensor, a temperature sensor, a humidity sensor, an illuminance sensor, a proximity sensor, a biosensor, an ultrasonic sensor, or an illuminance sensor 104.

According to various embodiments, the camera devices 105 and 108 may include a first camera device 105 (e.g., front camera device) disposed on the first surface 111 of the first housing 110, and a second camera device 108 disposed on the second surface 112 of the first housing 110. The electronic device 100 may further include a flash 109 disposed near the second camera device 108. According to an embodiment, the camera devices 105 and 108 may include one or a plurality of lenses, an image sensor, and/or an image signal processor. The flash 109 may include, for example, a light-emitting diode or a xenon lamp. According to an embodiment, in the camera devices 105 and 108, two or more lenses (wide angle lenses, ultra-wide angle lenses, or telephoto lenses) and image sensors may be disposed to be located on one surface (e.g., first surface 111, second surface 112, third surface 121, or fourth surface 122) of the electronic device 100. In an embodiment, the camera devices 105 and 108 may include lenses for time of flight (TOF) and image sensors.

According to various embodiments, the key input device 106 (e.g., key button) may be disposed on the third side surface 113c of the first side frame 113 of the first housing 110. In an embodiment, the key input device 106 may be disposed on at least one of different side surfaces 113a and 113b of the first housing 110 and/or side surfaces 123a, 123b, and 123c of the second housing 120. In an embodiment, the electronic device 100 may not include a part or all of the key input devices 106, and the key input device 106 that is not included may be implemented in another type, such as a soft key, on the flexible display 4000. In an embodiment, the key input device 106 may be implemented using a pressure sensor included in the flexible display 4000.

According to various embodiments, one camera device 105 of the camera devices 105 and 108 or the sensor module 104 may be disposed to be visually exposed through the flexible display 4000. For example, the first camera device 105 or the sensor module 104 may be disposed to come in contact with an external environment through an opening (e.g., through-hole) at least partly formed on the flexible display 4000 in an inner space of the electronic device 100. As an embodiment, the sensor module 104 may be disposed to perform its own function without being visually exposed through the flexible display 4000 in the inner space of the electronic device 100. For example, in such a case, the area, facing the sensor module, of the flexible display 4000 may not require an opening.

With reference to FIG. 2B, the electronic device 100 may operate to maintain the intermediate state through the hinge module (e.g., hinge module 140 of FIG. 3). In this case, the electronic device 100 may control the flexible display 4000 so that different kinds of content are displayed on a display area corresponding to the first surface 111 and a display area corresponding to the third surface 121. According to an embodiment, the electronic device 100 may operate substantially in the unfolding state (e.g., unfolding state of FIG. 1A) and/or substantially in the folding state (e.g., folding state of FIG. 2A) based on a specific angle of inflection (e.g., angle between the first housing 110 and the second housing 120 in the intermediate state) through the hinge module (e.g., hinge module 140 of FIG. 3). For example, if a pressing force is provided in an unfolding direction (direction B) in a state where the electronic device 100 is unfolded at the specific angle of inflection through the hinge module (e.g., hinge module 140 of FIG. 3), the electronic device 100 may operate to be transitioned to the unfolding state (e.g., unfolding state of FIG. 1A). For example, if a pressing force is provided in a folding direction (direction C) in a state where the electronic device 100 is unfolded at the specific angle of inflection through the hinge module (e.g., hinge module 140 of FIG. 3), the electronic device 100 may operate to be transitioned to the closed state (e.g., folding state of FIG. 2A). In an embodiment, the electronic device 100 may operate to maintain the unfolding state (not illustrated) at various angles through the hinge module (e.g., hinge module 140 of FIG. 3).

FIG. 3 is an exploded perspective view of an electronic device according to various embodiments.

With reference to FIG. 3, the electronic device 100 may include a first side frame 113, a second side frame 123, and a hinge module 140 rotatably connecting the first side frame 113 and the second side frame 123 to each other. According to an embodiment, the electronic device 100 may include a first support plate 1131 at least partly extending from the first side frame 113, and a second support plate 1231 at least partly extending from the second side frame 123. According to an embodiment, the first support plate 1131 may be formed in a body with the first side frame 113, or may be structurally combined with the first side frame 113. In the same or similar manner, the second support plate 1231 may be formed in a body with the second side frame 123, or may be structurally combined with the second side frame 123. According to an embodiment, the electronic device 100 may include a flexible display 4000 disposed to be supported by the first support plate 1131 and the second support plate 1231. According to an embodiment, the electronic device 100 may include a first rear cover 114 combined with the first side frame 113 and providing a first space with the first support plate 1131, and a second rear cover 124 combined with the second side frame 123 and providing a second space with the second support plate 1231. In an embodiment, the first side frame 113 and the first rear cover 114 may be formed in a body. In an embodiment, the second side frame 123 and the second rear cover 124 may be formed in a body. According to an embodiment, the electronic device 100 may include a first housing 110 (e.g., first housing 110 of FIG. 1A) (e.g., first housing structure) provided through the first side frame 113, the first support plate 1131, and the first rear cover 114. According to an embodiment, the electronic device 100 may include a second housing (e.g., second housing 120 of FIG. 1A) (e.g., second housing structure) provided through the second side frame 123, the second support plate 1231, and the second rear cover 124. According to an embodiment, the electronic device 100 may include a sub-display 131 disposed to be seen from an outside through at least a partial area of the first rear cover 114.

According to various embodiments, the electronic device 100 may include a first board assembly 161 (e.g., main printed circuit board) disposed in a first space between the first side frame 113 and the first rear cover 114, a camera assembly 163, a first battery 171, or a first bracket 151. According to an embodiment, the camera assembly 163 may include a plurality of camera devices (e.g., camera devices 105 and 108 of FIGS. 1A and 2A), and may be electrically connected to the first board assembly 161. According to an embodiment, the first bracket 151 may provide a support structure for supporting the first board assembly 161 and/or the camera assembly 163 and improved stiffness. According to an embodiment, the electronic device 100 may include a second board assembly 162 (e.g., sub-printed circuit board)

disposed in a second space between the second side frame 123 and the second rear cover 124, an antenna 190 (e.g., coil member), a second battery 172, or a second bracket 152. According to an embodiment, the electronic device 100 may include a wiring member 180 (e.g., flexible printed circuit board (FPCB)) disposed to extend from the first board assembly 161 to a plurality of electronic components (e.g., second board assembly 162, second battery 172, or antenna 190) disposed between the second side frame 123 and the second rear cover 124 across the hinge module 140, and providing an electrical connection. According to an embodiment, the antenna 190 may include a near field communication (NFC) antenna, a wireless charging antenna, and/or a magnetic secure transmission (MST) antenna. For example, the antenna 190 may perform a short-range communication with an external device, or may wirelessly transmit and receive a power necessary for charging.

According to various embodiments, the electronic device 100 may include a hinge housing 141 (e.g., hinge cover) supporting the hinge module 140, and disposed to be exposed to the outside when the electronic device 100 is in the folding state (e.g., folding state of FIG. 2A), and disposed not to seen from the outside through entering into the first space and/or the second space when the electronic device 100 is in the unfolding state (e.g., unfolding state of FIG. 1A).

According to various embodiments, the electronic device 100 may include the first protection cover 115 combined along the edge of the first side frame 113. According to an embodiment, the electronic device 100 may include the second protection cover 125 combined along the edge of the second side frame 123. According to an embodiment, in the flexible display 4000, the edge of the first flat part (first flat part 130a of FIG. 1B) may be protected by the first protection cover 115. According to an embodiment, in the flexible display 4000, the edge of the second flat part (e.g., second flat part 130b of FIG. 1B) may be protected by the second protection cover 125. According to an embodiment, the electronic device 100 may include the protection cap 135 disposed to protect the edge of the bendable part (e.g., bendable part 130c of FIG. 1B) corresponding to the hinge module 140 of the flexible display.

Figure 4:
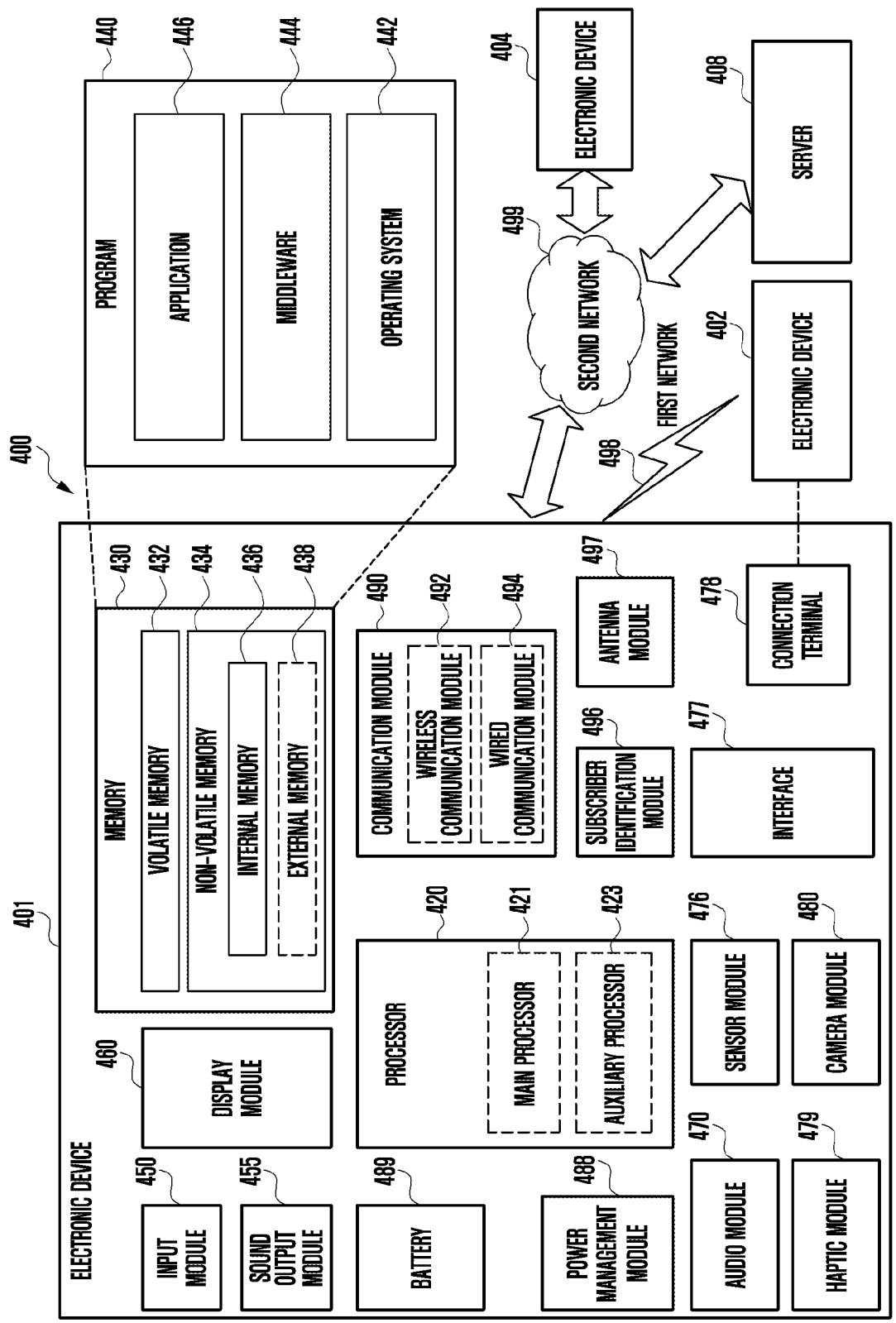
FIG. 4 is a block diagram of illustrating an example electronic device in a network environment according to various embodiments.

FIG. 4 is a block diagram illustrating an example electronic device 401 (e.g., the electronic device 100 of FIG. 1) in a network environment 400 according to various embodiments.

Referring to FIG. 4, the electronic device 401 (e.g., the electronic device 100 of FIG. 1) in the network environment 400 may communicate with an electronic device 402 via a first network 498 (e.g., a short-range wireless communication network), or at least one of an electronic device 404 or a server 408 via a second network 499 (e.g., a long-range wireless communication network). According to an embodiment, the electronic device 401 (e.g., the electronic device 100 of FIG. 1) may communicate with the electronic device 404 via the server 408. According to an embodiment, the electronic device 401 (e.g., the electronic device 100 of FIG. 1) may include a processor 420, memory 430, an input module 450, a sound output 4 module 455, a display module 460 (e.g., the flexible display 4000), an audio module 470, a sensor module 476, an interface 477, a connecting terminal 478, a haptic module 479, a camera module 480 (e.g., the camera devices 105 and 108), a power management module 488, a battery 489, a communication module 490, a subscriber identification module (SIM) 496, or an antenna module 497. In various embodiments, at least one of the components (e.g., the connecting terminal 478) may be omitted from the electronic device 401 (e.g., the electronic device 100 of FIG. 1), or one or more other components may be added in the electronic device 401 (e.g., the electronic device 100 of FIG. 1). In various embodiments, some of the components (e.g., the sensor module 476, the camera module 480, or the antenna module 497) may be implemented as a single component (e.g., the display module 460 (e.g., the flexible display 4000)).

The processor 420 may execute, for example, software (e.g., a program 440) to control at least one other component (e.g., a hardware or software component) of the electronic device 401 (e.g., the electronic device 100 of FIG. 1) coupled with the processor 420, and may perform various data processing or computation. According to an embodiment, as at least part of the data processing or computation, the processor 420 may store a command or data received from another component (e.g., the sensor module 476 (e.g., the sensor module 104 of FIG. 1) or the communication module 490) in volatile memory 432, process the command or the data stored in the volatile memory 432, and store resulting data in non-volatile memory 434. According to an embodiment, the processor 420 may include a main processor 421 (e.g., a central processing unit (CPU) or an application processor (AP)), or an auxiliary processor 423 (e.g., a graphics processing unit (GPU), a neural processing unit (NPU), an image signal processor (ISP), a sensor hub processor, or a communication processor (CP)) that is operable independently from, or in conjunction with, the main processor 421. For example, when the electronic device 401 (e.g., the electronic device 100 of FIG. 1) includes the main processor 421 and the auxiliary processor 423, the auxiliary processor 423 may be adapted to consume less power than the main processor 421, or to be specific to a specified function. The auxiliary processor 423 may be implemented as separate from, or as part of the main processor 421.

The auxiliary processor 423 may control at least some of functions or states related to at least one component (e.g., the display module 460 (e.g., the flexible display 4000), the sensor module 476 (e.g., the sensor module 104 of FIG. 1), or the communication module 490) among the components of the electronic device 401 (e.g., the electronic device 100 of FIG. 1), instead of the main processor 421 while the main processor 421 is in an inactive (e.g., sleep) state, or together with the main processor 421 while the main processor 421 is in an active state (e.g., executing an application). According to an embodiment, the auxiliary processor 423 (e.g., an image signal processor or a communication processor) may be implemented as part of another component (e.g., the camera module 480 (e.g., the camera devices 105 and 108) or the communication module 490) functionally related to the auxiliary processor 423. According to an embodiment, the auxiliary processor 423 (e.g., the neural processing unit) may include a hardware structure specified for artificial intelligence model processing. An artificial intelligence model may be generated by machine learning. Such learning may be performed, e.g., by the electronic device 401 (e.g., the electronic device 100 of FIG. 1) where the artificial intelligence is performed or via a separate server (e.g., the server 408). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 430 may store various data used by at least one component (e.g., the processor 420 or the sensor module 476) of the electronic device 401 (e.g., the electronic device 100 of FIG. 1). The various data may include, for example, software (e.g., the program 440) and input data or output data for a command related thereto. The memory 430 may include the volatile memory 432 or the non-volatile memory 434.

The program 440 may be stored in the memory 430 as software, and may include, for example, an operating system (OS) 442, middleware 444, or an application 446.

The input module 450 may receive a command or data to be used by another component (e.g., the processor 420) of the electronic device 401 (e.g., the electronic device 100 of FIG. 1), from the outside (e.g., a user) of the electronic device 401 (e.g., the electronic device 100 of FIG. 1). The input 4 module 450 may include, for example, a microphone, a mouse, a keyboard, a key (e.g., a button), or a digital pen (e.g., a stylus pen).

The sound output module 455 may output sound signals to the outside of the electronic device 401 (e.g., the electronic device 100 of FIG. 1). The sound output module 455 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 460 (e.g., flexible display 4000) may visually provide information to the outside (e.g., a user) of the electronic device 401 (e.g., the electronic device 100 of FIG. 1). The display module 460 may include, for example, a display, a hologram device, or a projector and control circuitry to control a corresponding one of the display, hologram device, and projector. According to an embodiment, the display module 460 (e.g., flexible display 4000) may include a touch sensor adapted to detect a touch, or a pressure sensor adapted to measure the intensity of force incurred by the touch.

The audio module 470 may convert a sound into an electrical signal and vice versa. According to an embodiment, the audio module 470 may obtain the sound via the input 4 module 450, or output the sound via the sound output module 455 or a headphone of an external electronic device (e.g., an electronic device 402) directly (e.g., wiredly) or wirelessly coupled with the electronic device 401 (e.g., the electronic device 100 of FIG. 1).

The sensor module 476 (e.g., the sensor module 104 of FIG. 1) may detect an operational state (e.g., power or temperature) of the electronic device 401 (e.g., the electronic device 100 of FIG. 1) or an environmental state (e.g., a state of a user) external to the electronic device 401 (e.g., the electronic device 100 of FIG. 1), and then generate an electrical signal or data value corresponding to the detected state. According to an embodiment, the sensor module 476 (e.g., the sensor module 104 of FIG. 1) may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 477 may support one or more specified protocols to be used for the electronic device 401 (e.g., the electronic device 100 of FIG. 1) to be coupled with the external electronic device (e.g., the electronic device 402) directly (e.g., wiredly) or wirelessly. According to an embodiment, the interface 477 may include, for example, a high definition multimedia interface (HDMI), a universal serial bus (USB) interface, a secure digital (SD) card interface, or an audio interface.

A connecting terminal 478 may include a connector via which the electronic device 401 (e.g., the electronic device 100 of FIG. 1) may be physically connected with the external electronic device (e.g., the electronic device 402). According to an embodiment, the connecting terminal 478 may include, for example, a HDMI connector, a USB connector, a SD card connector, or an audio connector (e.g., a headphone connector).

The haptic module 479 may convert an electrical signal into a mechanical stimulus (e.g., a vibration or a movement) or electrical stimulus which may be recognized by a user via his tactile sensation or kinesthetic sensation. According to an embodiment, the haptic module 479 may include, for example, a motor, a piezoelectric element, or an electric stimulator.

The camera module 480 (e.g., the camera devices 105 and 108) may capture a still image or moving images. According to an embodiment, the camera module 480 (e.g., the camera devices 105 and 108) may include one or more lenses, image sensors, image signal processors, or flashes.

The power management module 488 may manage power supplied to the electronic device 401 (e.g., the electronic device 100 of FIG. 1). According to an embodiment, the power management module 488 may be implemented as at least part of, for example, a power management integrated circuit (PMIC).

The battery 489 may supply power to at least one component of the electronic device 401 (e.g., the electronic device 100 of FIG. 1). According to an embodiment, the battery 489 may include, for example, a primary cell which is not rechargeable, a secondary cell which is rechargeable, or a fuel cell.

The communication module 490 may support establishing a direct (e.g., wired) communication channel or a wireless communication channel between the electronic device 401 (e.g., the electronic device 100 of FIG. 1) and the external electronic device (e.g., the electronic device 402, the electronic device 404, or the server 408) and performing communication via the established communication channel. The communication module 490 may include one or more communication processors that are operable independently from the processor 420 (e.g., the application processor (AP)) and supports a direct (e.g., wired) communication or a wireless communication. According to an embodiment, the communication module 490 may include a wireless communication module 492 (e.g., a cellular communication module, a short-range wireless communication module, or a global navigation satellite system (GNSS) communication module) or a wired communication module 494 (e.g., a local area network (LAN) communication module or a power line communication (PLC) module). A corresponding one of these communication modules may communicate with the external electronic device via the first network 498 (e.g., a short-range communication network, such as Bluetooth™, wireless-fidelity (Wi-Fi) direct, or infrared data association (IrDA)) or the second network 499 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 492 may identify and authenticate the electronic device 401 (e.g., the electronic device 100 of FIG. 1) in a communication network, such as the first network 498 or the second network 499, using subscriber information (e.g., international mobile subscriber identity (IMSI)) stored in the subscriber identification module 496.

The wireless communication module 492 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 492 may support a high-frequency band (e.g., the mmWave band) to achieve, e.g., a high data transmission rate. The wireless communication module 492 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 492 may support various requirements specified in the electronic device 401 (e.g., the electronic device 100 of FIG. 1), an external electronic device (e.g., the electronic device 404), or a network system (e.g., the second network 499). According to an embodiment, the wireless communication module 492 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 497 may transmit or receive a signal or power to or from the outside (e.g., the external electronic device) of the electronic device 401. According to an embodiment, the antenna module 497 may include an antenna including a radiating element including a conductive material or a conductive pattern formed in or on a substrate (e.g., a printed circuit board (PCB)). According to an embodiment, the antenna module 497 may include a plurality of antennas (e.g., array antennas). In such a case, at least one antenna appropriate for a communication scheme used in the communication network, such as the first network 498 or the second network 499, may be selected, for example, by the communication module 490 (e.g., the wireless communication module 492) from the plurality of antennas. The signal or the power may then be transmitted or received between the communication module 490 and the external electronic device via the selected at least one antenna. According to an embodiment, another component (e.g., a radio frequency integrated circuit (RFIC)) other than the radiating element may be additionally formed as part of the antenna module 497.

According to various embodiments, the antenna module 497 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 401 and the external electronic device 404 via the server 408 coupled with the second network 499. Each of the electronic devices 402 or 404 may be a device of a same type as, or a different type, from the electronic device 401 (e.g., the electronic device 100 of FIG. 1). According to an embodiment, all or some of operations to be executed at the electronic device 401 may be executed at one or more of the external electronic devices 402, 404, or 408. For example, if the electronic device 401 (e.g., the electronic device 100 of FIG. 1) should perform a function or a service automatically, or in response to a request from a user or another device, the electronic device 401 (e.g., the electronic device 100 of FIG. 1), instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 401 (e.g., the electronic device 100 of FIG. 1). The electronic device 401 (e.g., the electronic device 100 of FIG. 1) may provide the outcome, with or without further processing of the outcome, as at least part of a reply to the request. To that end, a cloud computing, distributed computing, mobile edge computing (MEC), or client-server computing technology may be used, for example. The electronic device 401 (e.g., the electronic device 100 of FIG. 1) may provide ultra low-latency services using, e.g., distributed computing or mobile edge computing. In an embodiment, the external electronic device 404 may include an internet-of-things (IoT) device. The server 408 may be an intelligent server using machine learning and/or a neural network. According to an embodiment, the external electronic device 404 or the server 408 may be included in the second network 499. The electronic device 401 (e.g., the electronic device 100 of FIG. 1) may be applied to intelligent services (e.g., smart home, smart city, smart car, or healthcare) based on 5G communication technology or IoT-related technology.

Figure 5:
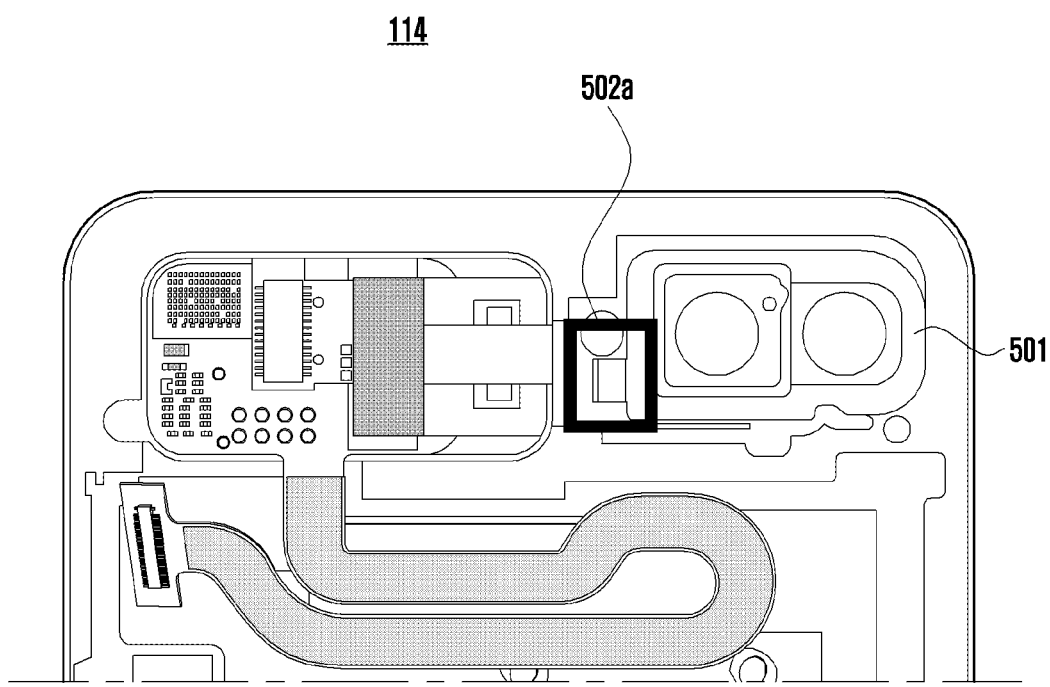
FIG. 5 is a diagram illustrating a part of a first rear cover of an electronic device according to various embodiments.

FIG. 5 is a diagram illustrating a part of a first rear cover 114 of an electronic device 100 (e.g., electronic device 401 of FIG. 4) according to various embodiments.

Figure 6:
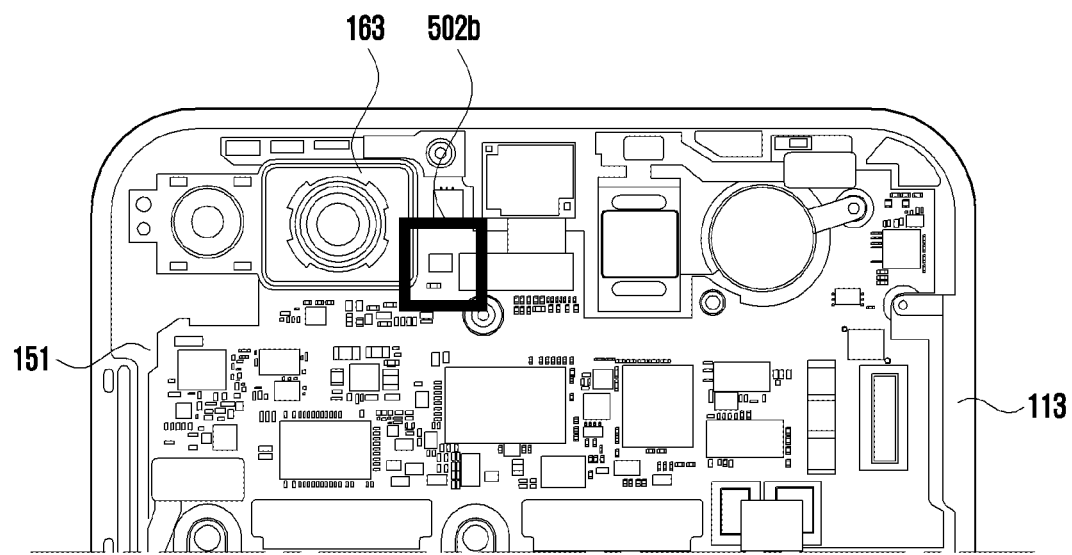
FIG. 6 is a diagram illustrating a part of a rear surface of an electronic device from which a first rear cover is removed according to various embodiments.

FIG. 6 is a diagram illustrating a part of a rear surface of an electronic device 100 (e.g., electronic device 401 of FIG. 4) from which a first rear cover 114 is removed according to various embodiments.

Figure 7:
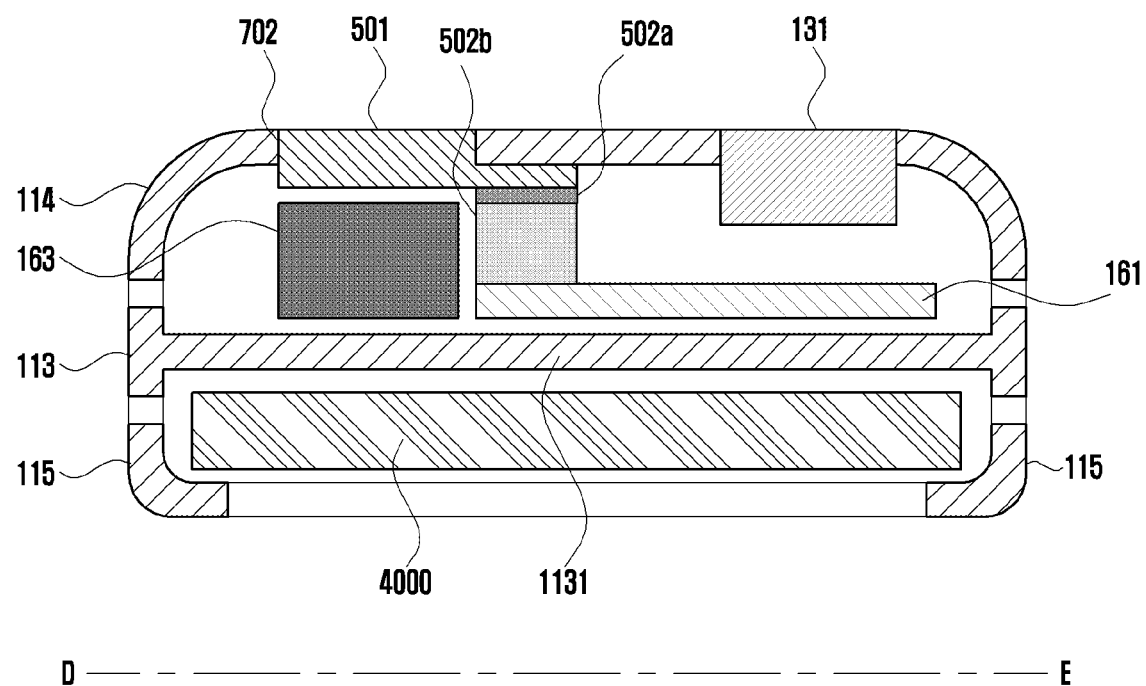
FIG. 7 is a cross-sectional view of an electronic device of FIG. 1C taken along line D-E according to various embodiments.

FIG. 7 is a cross-sectional view of an electronic device 100 (e.g., electronic device 401 of FIG. 4) of FIG. 1C taken along line D-E according to various embodiments.

Figure 8:
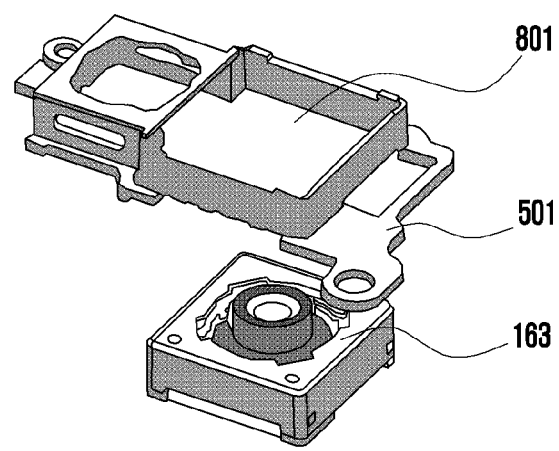
FIG. 8 is an exploded perspective view illustrating a camera module and a first grip sensor according to various embodiments.

FIG. 8 is a perspective view illustrating a camera module 163 and a first grip sensor 501 according to various embodiments.

With reference to FIGS. 5 to 8, the first rear cover 114 may include the first grip sensor 501.

According to various embodiments, the first rear cover 114 may include the first grip sensor 501 and a first contact member 502a. The first grip sensor 501 may be disposed in at least a partial area of the first rear cover 114. The first grip sensor 501 may be a camera decoration (or camera accessory). The first grip sensor 501 may be formed on a surface having the same height as the first rear cover 114. The first grip sensor 501 may be formed to cover the camera module 163. In case that the first grip sensor 501 is formed to cover the camera module 163, a first opening 801 that fits the size of the camera module 163 may be formed in a place corresponding to the camera module 163. The first grip sensor 501 may include an area capable of covering the camera module 163.

In various embodiments, the camera module 163 may include the first grip sensor 501. For example, the first grip sensor 501 may be combined with the camera module 163, and may be located on the rear surface of the first rear cover 114 or at least a part of a second opening 702 formed on the first rear cover 114.

In various embodiments, the first grip sensor 501 may be included in the area of the first rear cover 114 being spaced apart for a specific distance (or predetermined distance) or more from the first side frame 113. The first grip sensor 501 may be electrically separated from the first side frame 113. Even if the first side frame 113 and the second side frame 123 come in contact with each other in the folding state of the electronic device 100, the first grip sensor 501 may be electrically separated from the second side frame 123.

In various embodiments, at least a part of the first rear cover 114 may include at least a part of the sub-display 131.

In various embodiments, the first board assembly 161 and the camera module 163 may be exposed from the first housing 110 from which the first rear cover 114 is removed. The first board assembly 161 may include a second contact member 502b. The second contact member 502b may be electrically connected to a grip sensor integrated circuit (IC) (not illustrated) included in the second housing 120 and/or the processor 420 included in the second housing 120. The first side frame 113 may be connected to the first support plate 1131, and the first support plate 1131 may support the first board assembly 161 in the direction of the rear surface 112, and may support the flexible display 4000 in the direction of the front surface 111. The first protection cover 115 may be combined along the edge of the first side frame 113, and may protect the edge of the flexible display 4000.

In various embodiments, at least one of the first contact member 502a or the second contact member 502b may be omitted. For example, the first contact member 502a or the second contact member 502b may be located on the first grip sensor 501 or the first board assembly 161.

In various embodiments, the camera device 108 included in the rear surface 112 of the electronic device 100 (e.g., electronic device 401 of FIG. 4) may include the camera first grip sensor 501 included in the first rear cover 114 and the camera module 163.

In various embodiments, the first grip sensor 501 may fix or support a cover window (not illustrated) capable of protecting the camera module 163. Further, the first grip sensor 501 may include a shape for decoration to give aesthetic to the camera device 108. The first grip sensor 501 may be of a conductive material (e.g., metal).

In various embodiments, the first grip sensor 501 may be electrically connected to the first contact member 502a.

In various embodiments, the first grip sensor 501 having the conductive material may become an electrical passage through which static electricity generated by an external object or human body is transferred to an inside of the electronic device 100 (e.g., electronic device 401 of FIG. 4).

In various embodiments, in order to prevent and/or reduce the static electricity from leaking through the first grip sensor 501 of the electronic device 100 (e.g., electronic device 401 of FIG. 4), a gasket tape may be attached around the first grip sensor 501. The gasket tape may be of a conductive material, and may be electrically connected to the first contact member 502a. In various embodiments, the first contact member 502a may be at least a part of the gasket tape.

Figure 9:
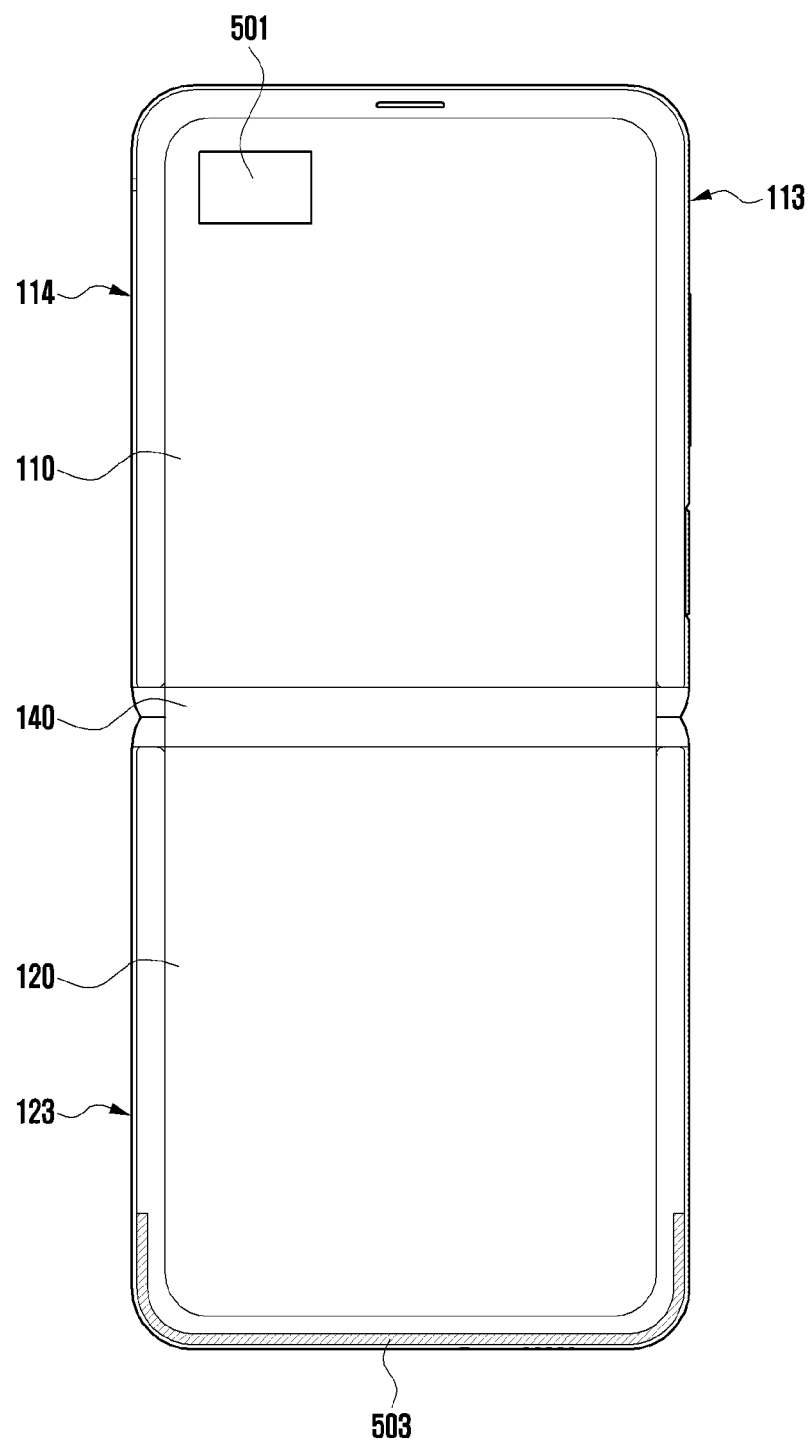
FIG. 9 is a diagram illustrating a first grip sensor and a second grip sensor included in an electronic device according to various embodiments.

FIG. 9 is a diagram illustrating a first grip sensor 501 and a second grip sensor 503 included in an electronic device 100 (e.g., electronic device 401 of FIG. 4) according to various embodiments.

In various embodiments, the electronic device 100 (e.g., electronic device 401 of FIG. 4) may include the first housing 110, the second housing 120, and the hinge module 140. In the electronic device 100, the first housing 110 and the second housing 120 may be in the closed folding state or in the open unfolding state through the hinge module 140.

In various embodiments, the first grip sensor 501 may be a camera decoration disposed on at least a part of the first rear cover 114 of the first housing 110.

In various embodiments, the first grip sensor 501 may be included in the area of the first rear cover 114 that is far apart for a specific distance (or predetermined distance) or more from the first side frame 113. The first grip sensor 501 may be electrically separated from the first side frame 113. Even if the first side frame 113 and the second side frame 123 come in contact with each other in the folding state of the electronic device 100, the first grip sensor 501 may be electrically separated from the second side frame 123.

In various embodiments, the second grip sensor 503 may be disposed on at least a part of the second side frame 123. The second grip sensor 503 may be included in at least a partial area of the second side frame 123. The electronic device 100 (e.g., electronic device 401 of FIG. 4) may include the antenna provided using the second side frame 123 on a part of a lower end area of the second housing 120. If it is assumed that the area in which the second housing 120 and the hinge module 140 are connected to each other is referred to as an upper end area, the other end of the upper end area and/or the area that is in parallel to the upper end area may be referred to as the lower end area of the second housing 120.

In various embodiments, the first grip sensor 501 and/or the second grip sensor 503 may be electrically connected to the grip sensor integrated circuit (IC) (not illustrated) and/or the processor 420.

In various embodiments, the first grip sensor 501 and/or the second grip sensor 503 may be electrically connected to the grip sensor integrated circuit (IC) (not illustrated) included in the second housing 120 and/or the processor 420 included in the second housing 120.

In various embodiments, the first grip sensor 501 and/or the second grip sensor 503 may be controlled by the grip sensor integrated circuit (IC) (not illustrated) and/or the processor 420.

In various embodiments, if a dielectric material approaches the first grip sensor 501 and/or the second grip sensor 503, capacitance of the first grip sensor 501 and/or the second grip sensor 503 may be changed.

In various embodiments, the grip sensor integrated circuit (IC) (not illustrated) and/or the processor 420 may sense the variation of capacitance of the first grip sensor 501 and/or the second grip sensor 503.

In various embodiments, the grip sensor integrated circuit (IC) (not illustrated) may sense the capacitance variation of the first grip sensor 501 and/or the second grip sensor 503, and may transfer information on the capacitance variation of the first grip sensor 501 and/or the second grip sensor 503 to the processor 420.

In various embodiments, the processor 420 may determine whether the human body approaches the electronic device 100 based on the information on the capacitance variation of the first grip sensor 501 and/or the second grip sensor 503 transferred from the grip sensor integrated circuit (IC) (not illustrated).

According to various embodiments, when the first grip sensor 501 and/or the second grip sensor 503 sense the capacitance variation, the grip sensor integrated circuit (IC) (not illustrated) and/or the processor 420 may sense the capacitance variation using a base capacitance value, and may adjust the base capacitance value.

According to various embodiments, the grip sensor integrated circuit (IC) (not illustrated) and/or the processor 420 may determine the proximity of the human body with the electronic device 100 by comparing the capacitance of the first grip sensor 501 and/or the second grip sensor 503 with a predetermined criterion (or predetermined capacitance).

According to various embodiments, the grip sensor integrated circuit (IC) (not illustrated) and/or the processor 420 may determine that the human body has approached the electronic device 100 in case that the capacitance of the first grip sensor 501 and/or the second grip sensor 503 is equal to or higher than the predetermined criterion (or predetermined capacitance).

According to various embodiments, the grip sensor integrated circuit (IC) (not illustrated) and/or the processor 420 may determine that the human body has not approached the electronic device 100 in case that the capacitance of the first grip sensor 501 and/or the second grip sensor 503 is lower than the predetermined criterion (or predetermined capacitance).

According to various embodiments, the processor 420 may determine whether the human body has approached using the first grip sensor 501 and/or the second grip sensor 503.

According to various embodiments, the processor 420 may determine whether the human body has approached using the first grip sensor 501 and/or the second grip sensor 503. The processor 420 may adjust the power so as to adjust the specific absorption rate (SAR) depending on the result of determining whether the human body has approached.

According to various embodiments, the processor 420 may determine whether the human body has approached using the first grip sensor 501 and/or the second grip sensor 503. The processor 420 may adjust the power being used by the electronic device 100 depending on the result of determining whether the human body has approached.

According to various embodiments, the processor 420 may determine whether the human body has approached using the first grip sensor 501 and/or the second grip sensor 503. The processor 420 may adjust the radiated power being used by the electronic device 100 depending on the result of determining whether the human body has approached.

According to various embodiments, the processor 420 may determine whether the human body has approached using the first grip sensor 501 and/or the second grip sensor 503. The processor 420 may adjust the power being supplied to the electronic device 100 by controlling a power management module 488 depending on the result of determining whether the human body has approached.

According to various embodiments, the processor 420 may sense an electrical signal being generated by a hall sensor or a magnetic sensor included in the electronic device 100, determine the closed or open state of the first housing 110 and/or the second housing 120, and determine whether the electronic device 100 is in the unfolding state or in the folding state.

According to various embodiments, the hall sensor or the magnetic sensor included in the electronic device 100 may sense the change of a magnetic field by the closed or open state of the first housing 110 and/or the second housing 120, change the magnetic field change to an electrical signal, and transfer the electrical signal to a hall sensor IC (not illustrated) and/or the processor 420.

Figure 10:
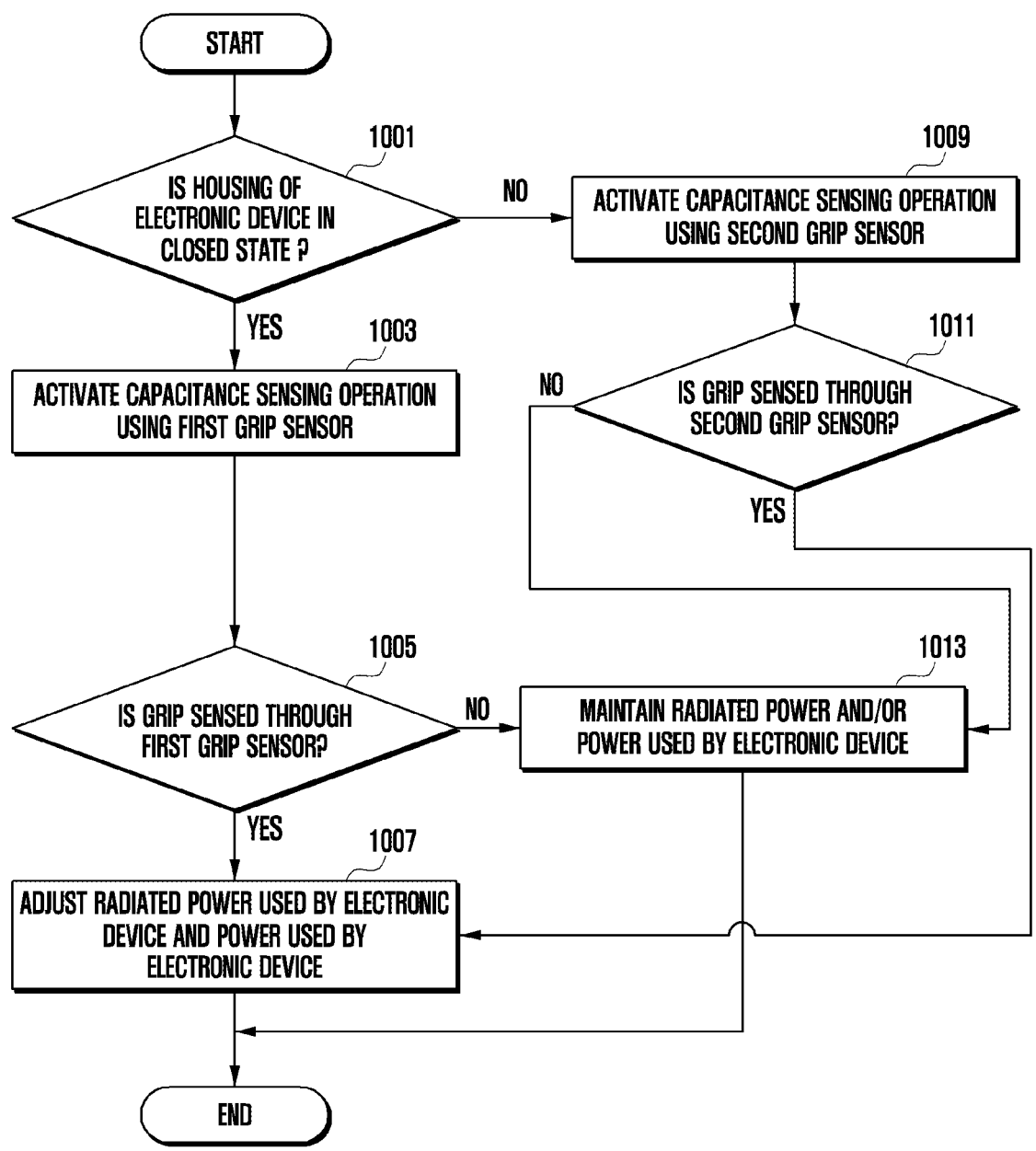
FIG. 10 is a flowchart illustrating an example power control method of an electronic device according to various embodiments.

FIG. 10 is a flowchart illustrating an example power control method of an electronic device 100 according to various embodiments.

In various embodiments, the electronic device 100 (e.g., electronic device 401 of FIG. 4), at operation 1001, may determine whether the housings (e.g., the first housing 110 and the second housing 120) are in the closed state under the control of the processor 420.

In various embodiments, the electronic device 100 (e.g., electronic device 401 of FIG. 4), at operation 1001, may sense an electrical signal being generated by a hall sensor or a magnetic sensor included in the electronic device 100 under the control of the processor 420, determine the closed or open state of the first housing 110 and/or the second housing 120, and determine whether the electronic device 100 is in the unfolding state or in the folding state.

In various embodiments, if the housings (e.g., first housing 110 and second housing 120) are determined to be in the closed state under the control of the processor 420 at operation 1001, the electronic device 100 (e.g., electronic device 401 of FIG. 4) may be branched to operation 1003.

In various embodiments, if the housings (e.g., first housing 110 and second housing 120) are not in the closed state (e.g., unfolding state) under the control of the processor 420 at operation 1001, the electronic device 100 (e.g., electronic device 401 of FIG. 4) may be branched to operation 1009.

In various embodiments, if the housings (e.g., first housing 110 and second housing 120) of the electronic device 100 are determined to be in the closed state, the electronic device 100 (e.g., electronic device 401 of FIG. 4), at operation 1003, may activate the capacitance sensing operation using the first grip sensor 501 under the control of the processor 420. For example, at operation 1003, the activation of the capacitance sensing operation using the first grip sensor 501 may be sensing of the capacitance change of the first grip sensor 501.

In various embodiments, the electronic device 100 (e.g., electronic device 401 of FIG. 4), at operation 1003, may activate the capacitance sensing operation using the first grip sensor 501 included in the first housing 110 under the control of the processor 420.

For example, at operation 1003, under the control of the processor 420, the activation of the capacitance sensing operation using the first grip sensor 501 may be adjustment of the base capacitance value of the grip sensor integrated circuit (IC) (not illustrated) and/or the processor 420 for sensing the capacitance variation of the first grip sensor 501. For example, at operation 1003, under the control of the processor 420, the activation of the first grip sensor 501 may be turn-on of the capacitance sensing operation of the first grip sensor 501 through the grip sensor integrated circuit (IC) (not illustrated) and/or the processor 420.

For example, at operation 1003, under the control of the processor 420, the activation of the first grip sensor 501 may be activation of the capacitance sensing operation of the first grip sensor 501 through the grip sensor integrated circuit (IC) (not illustrated) and/or the processor 420 and deactivation of the capacitance sensing operation of the second grip sensor 503 through the grip sensor integrated circuit (IC) (not illustrated) and/or the processor 420. The deactivation of the capacitance sensing operation of the second grip sensor 503 through the grip sensor integrated circuit (IC) (not illustrated) and/or the processor 420 may be turn-off of the capacitance sensing operation of the second grip sensor 503 through the grip sensor integrated circuit (IC) (not illustrated) and/or the processor 420. The deactivation of the capacitance sensing operation of the second grip sensor 503 through the grip sensor integrated circuit (IC) (not illustrated) and/or the processor 420 may be resetting of the base capacitance for sensing the capacitance of the second grip sensor 503 of the grip sensor integrated circuit (IC) (not illustrated) and/or the processor 420.

In various embodiments, the electronic device 100 (e.g., electronic device 401 of FIG. 4), at operation 1005, may determine whether the human body grip is sensed through the first grip sensor 501 under the control of the processor 420.

In various embodiments, the electronic device 100 (e.g., electronic device 401 of FIG. 4), at operation 1005, may determine whether the proximity and/or contact of the human body with the electronic device 100 (e.g., electronic device 401 of FIG. 4) is sensed through the first grip sensor 501 under the control of the processor 420.

For example, at operation 1005, the processor 420 may determine that the human body has approached the electronic device 100 in case that the capacitance sensed by the first grip sensor 501 is equal to or higher than a predetermined criterion (or predetermined capacitance).

For example, at operation 1005, the processor 420 may determine that the human body has not approached the electronic device 100 in case that the capacitance sensed by the first grip sensor 501 is lower than the predetermined criterion (or predetermined capacitance).

In various embodiments, the electronic device 100 (e.g., electronic device 401 of FIG. 4), at operation 1005, may be branched to operation 1007 in case that the human body grip is sensed through the first grip sensor 501 under the control of the processor 420.

In various embodiments, the electronic device 100 (e.g., electronic device 401 of FIG. 4), at operation 1005, may be branched to operation 1013 in case that the human body grip is not sensed through the first grip sensor 501 under the control of the processor 420.

In various embodiments, in case that the human body grip is sensed through the first grip sensor 501, the electronic device 100 (e.g., electronic device 401 of FIG. 4), at operation 1007, may control the radiated power being used by the electronic device 100 and/or the power being used by the electronic device 100 under the control of the processor 420.

In various embodiments, in case that the human body grip is sensed through the first grip sensor 501, the electronic device 100 (e.g., electronic device 401 of FIG. 4), at operation 1007, may control the radiated power being used by the electronic device 100 and/or the power being used by the electronic device 100 in order to adjust the specific absorption rate (SAR) under the control of the processor 420.

In various embodiments, in case that the human body grip is sensed through the first grip sensor 501, the electronic device 100 (e.g., electronic device 401 of FIG. 4), at operation 1007, may control the radiated power being used by the electronic device 100 and/or the power being used by the electronic device 100 to become a predetermined power or less in order to adjust the specific absorption rate (SAR) under the control of the processor 420.

In various embodiments, in case that the human body grip is sensed through the first grip sensor 501, the electronic device 100 (e.g., electronic device 401 of FIG. 4), at operation 1007, may lower the radiated power being used by the electronic device 100 and/or the power being used by the electronic device 100 in order to adjust the specific absorption rate (SAR) under the control of the processor 420.

In various embodiments, the electronic device 100 may include a memory 430 for storing information on the specific absorption rate (SAR) corresponding to the human body proximity. The electronic device 100 may store, in the memory 430, information on the radiated power corresponding to the specific absorption rate (SAR) and/or the power being used by the electronic device 100.

In various embodiments, the electronic device 100 may store, in the memory 430, the information on the radiated power corresponding to the specific absorption rate (SAR) and/or the power being used by the electronic device 100 in the form of a lookup table.

In various embodiments, in case that a user's grip is sensed through the first grip sensor 501, the electronic device 100 (e.g., electronic device 401 of FIG. 4), at operation 1007, may control the radiated power and/or the power of the electronic device 100 using information on the radiated power corresponding to the specific absorption rate (SAR) and/or the power being used by the electronic device 100 stored in the memory 430 in order to adjust the radiated power being used by the electronic device 100 and/or the power being used by the electronic device 100 under the control of the processor 420.

In various embodiments, in case that the user's grip is not sensed through the first grip sensor 501, the electronic device 100 (e.g., electronic device 401 of FIG. 4), at operation 1013, may maintain the specific absorption rate (SAR) under the control of the processor 420.

In various embodiments, in case that the user's grip is not sensed through the first grip sensor 501, the electronic device 100 (e.g., electronic device 401 of FIG. 4), at operation 1013, may maintain the radiated power being used by the electronic device 100 and/or the power being used by the electronic device 100 under the control of the processor 420.

In various embodiments, in case that the housings (e.g., first housing 110 and second housing 120) of the electronic device 100 is not in the closed state (e.g., in the unfolding state), the electronic device 100 (e.g., electronic device 401 of FIG. 4), at operation 1009, may activate the capacitance sensing operation using the second grip sensor 503 under the control of the processor 420.

For example, at operation 1009, the grip sensor integrated circuit (IC) (not illustrated) and/or the processor 420 may sense the capacitance variation of the second grip sensor 503 based on the base capacitance value. At operation 1009, under the control of the processor 420, the activation of the capacitance sensing operation using the second grip sensor 503 may be the adjustment of the base capacitance value of the grip sensor integrated circuit (IC) (not illustrated) and/or the processor 420 for sensing the capacitance variation using the second grip sensor 503. For example, at operation 1009, the activation of the capacitance sensing operation using the second grip sensor 503 may be sensing of the capacitance variation using the second grip sensor 503.

For example, at operation 1009, under the control of the processor 420, the activation of the second grip sensor 503 may be turn-on of the capacitance sensing operation of the second grip sensor 503 through the grip sensor integrated circuit (IC) (not illustrated) and/or the processor 420.

For example, at operation 1003, under the control of the processor 420, the activation of the second grip sensor 503 may be the activation of the capacitance sensing operation of the second grip sensor 503 through the grip sensor integrated circuit (IC) (not illustrated) and/or the processor 420, and the deactivation of the capacitance sensing operation of the first grip sensor 501 through the grip sensor integrated circuit (IC) (not illustrated) and/or the processor 420. The deactivation of the capacitance sensing operation of the first grip sensor 501 through the grip sensor integrated circuit (IC) (not illustrated) and/or the processor 420 may be turn-off of the capacitance sensing operation of the first grip sensor 501 through the grip sensor integrated circuit (IC) (not illustrated) and/or the processor 420. The deactivation of the capacitance sensing operation of the first grip sensor 501 through the grip sensor integrated circuit (IC) (not illustrated) and/or the processor 420 may be resetting of the base capacitance for sensing the capacitance of the first grip sensor 501 of the grip sensor integrated circuit (IC) (not illustrated) and/or the processor 420.

In various embodiments, the second grip sensor 503 may be disposed on at least a part of the second side frame 123. The second grip sensor 503 may be included in at least a partial area of the second side frame 123. The electronic device 100 (e.g., electronic device 401 of FIG. 4) may include the antenna provided using the second side frame 123 on a part of a lower end area of the second housing 120. If it is assumed that the area in which the second housing 120 and the hinge module 140 are connected to each other is referred to as an upper end area, the other end of the upper end area and/or the area that is in parallel to the upper end area may be referred to as the lower end area of the second housing 120.

In various embodiments, the electronic device 100 (e.g., electronic device 401 of FIG. 4), at operation 1011, may determine whether the human body grip is sensed through the second grip sensor 503 under the control of the processor 420.

In various embodiments, the electronic device 100 (e.g., electronic device 401 of FIG. 4), at operation 1011, may determine whether the proximity and/or contact of the human body with the electronic device 100 (e.g., electronic device 401 of FIG. 4) is sensed through the second grip sensor 503 under the control of the processor 420.

For example, at operation 1011, the processor 420 may determine that the human body has approached the electronic device 100 in case that the capacitance sensed by the second grip sensor 503 is equal to or higher than a predetermined criterion (or predetermined capacitance).

For example, at operation 1011, the processor 420 may determine that the human body has not approached the electronic device 100 in case that the capacitance sensed by the second grip sensor 503 is lower than the predetermined criterion (or predetermined capacitance).

In various embodiments, the electronic device 100 (e.g., electronic device 401 of FIG. 4), at operation 1011, may be branched to operation 1007 in case that the user's grip is sensed through the second grip sensor 503 under the control of the processor 420.

In various embodiments, the electronic device 100 (e.g., electronic device 401 of FIG. 4), at operation 1011, may be branched to operation 1013 in case that the human body grip is not sensed through the second grip sensor 503 under the control of the processor 420.

In various embodiments, in case that the human body grip is sensed through the second grip sensor 503, the electronic device 100 (e.g., electronic device 401 of FIG. 4), at operation 1007, may adjust the specific absorption rate (SAR) under the control of the processor 420.

In various embodiments, in case that the user's grip is sensed through the second grip sensor 503, the electronic device 100 (e.g., electronic device 401 of FIG. 4), at operation 1007, may adjust the radiated power being used by the electronic device 100 and/or the power being used by the electronic device 100 in order to adjust the specific absorption rate (SAR) under the control of the processor 420.

In various embodiments, in case that the user's grip is sensed through the second grip sensor 503, the electronic device 100 (e.g., electronic device 401 of FIG. 4), at operation 1007, may lower the radiated power being used by the electronic device 100 and/or the power being used by the electronic device 100 in order to adjust the specific absorption rate (SAR) under the control of the processor 420.

In various embodiments, in case that the user's grip is sensed through the second grip sensor 503, the electronic device 100 (e.g., electronic device 401 of FIG. 4), at operation 1007, may adjust the radiated power being used by the electronic device 100 and/or the power being used by the electronic device 100 to be equal to or lower than the predetermined power in order to adjust the specific absorption rate (SAR) under the control of the processor 420. In various embodiments, in case that the user's grip is sensed through the second grip sensor 503, the electronic device 100 (e.g., electronic device 401 of FIG. 4), at operation 1007, may control the radiated power and/or the power of the electronic device 100 using information on the radiated power corresponding to the specific absorption rate (SAR) stored in the memory 430 and/or the power being used by the electronic device 100 in order to adjust the radiated power being used by the electronic device 100 and/or the power being used by the electronic device 100 under the control of the processor 420.

In various embodiments, in case that the user's grip is not sensed through the second grip sensor 503, the electronic device 100 (e.g., electronic device 401 of FIG. 4), at operation 1013, may maintain the radiated power being used by the electronic device 100 and/or the power being used by the electronic device 100 under the control of the processor 420. At operation 1013, under the control of the processor 420, the maintaining of the radiated power being used by the electronic device 100 and/or the power being used by the electronic device 100 may be maintaining of the current state without adjusting the radiated power and/or the power being used by the electronic device 100.

The electronic devices according to various embodiments may be various types of devices. The electronic device may include, for example, a portable communication device (e.g., smart phone), a computer device, a portable multimedia device, a portable medical device, a camera, a wearable device, a home appliance, or the like. The electronic devices according to various embodiments are not limited to the above-described devices.

It should be appreciated that various embodiments of the present disclosure and the terms used therein are not intended to limit the technological features set forth herein to particular embodiments and include various changes, equivalents, and/or replacements for a corresponding embodiment. With regard to the description of the drawings, similar reference numerals may be used to refer to similar elements. A singular form of a noun corresponding to an item may include one or a plurality of items, unless the relevant context clearly indicates otherwise. As used in the disclosure, each of such phrases as "A or B," "at least one of A and B," "at least one of A or B," "A, B, or C," "at least one of A, B, and C," or "at least one of A, B, or C" may include any one or all possible combinations of the items enumerated together. Such terms as "1$^{st}$," "2$^{nd}$," "first," or "second" may be used to simply distinguish a corresponding component from another, and does not limit the components in other aspect (e.g., importance or order). If it is described that if an element (e.g., a first element) is referred to, with or without the term "operatively" or "communicatively", as "connected to," or "coupled to" another element (e.g., a second element), the element may be connected to the other element directly (e.g., by wire), wirelessly, or via a third element.

As used in the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments of the disclosure may be implemented as software (e.g., program 440) including one or more instructions stored in a machine (e.g., electronic device 401)-readable storage medium (e.g., internal memory 436 or external memory 438) that is readable by a machine (e.g., electronic device 101). For example, a processor (e.g., processor 420) of the machine (e.g., electronic device 401) may call at least one of one or more stored instructions from the storage media and may execute the called instructions. This enables the machine to perform at least one function in accordance with the at least one called instructions. The one or more instructions may include a code generated or executed by a complier or an interpreter. The machine-readable storage medium may be provided in the form of a non-transitory storage medium. The "non-transitory" storage medium is a tangible device, and may not include a signal (e.g., electromagnetic waves), but this term does not differentiate between data semi-permanently stored in the storage medium and temporarily stored in the storage medium.

According to an embodiment, a method according to various embodiments disclosed in the disclosure may be included and provided in a computer program product. The computer program product may be traded as a product between a seller and a buyer. The computer program product may be distributed in the form of a machine-readable storage medium (e.g., compact disc read only memory (CD-ROM)), or be directly distributed online (e.g., download or upload) via an application store (e.g., Play Store™) or between two user devices (e.g., smartphones). In case of online distribution, at least a part of the computer program product may be temporarily generated or at least temporarily stored in the machine-readable storage medium, such as memory of a manufacturer's server, a server of an application store, or a relay server.

According to various embodiments, each component (e.g., module or program) of the above-described components may include a single entity or multiple entities, and some of the plurality of entities may be disposed separately from other components. According to various embodiments, one or more of the above-described corresponding components or operations may be omitted, or one or more other components or operations may be added. Alternatively or additionally, a plurality of components (e.g., modules or programs) may be integrated into a single component, and the integrated component may still perform functions of the plurality of components in the same or similar manner as they are performed before being integrated. According to various embodiments, operations performed by the module, the program, or another component may be carried out sequentially, in parallel, repeatedly, or heuristically, or one or more of the operations may be executed in a different order or omitted, or other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device including a first housing and a second housing facing each other and combined with each other and configured to be folded or unfolded, the electronic device comprising:
    a first grip sensor included in the first housing;
    a second grip sensor included in the second housing; and
    a processor,
    wherein the processor is configured to:
        determine a closed state or an unfolded state of the electronic device,
        sense a proximity and/or contact of a human body using the second grip sensor and adjust a radiated power of the electronic device and/or a power of the electronic device based on the sensed proximity and/or contact of the human body based on the electronic device being determined to be in the unfolded state, and
        sense the proximity and/or contact of the human body using the first grip sensor and adjust the radiated power of the electronic device and/or the power of the electronic device based on the sensed proximity and/or contact of the human body based on the electronic device being determined to be in the folded state.

2. The electronic device of claim 1, wherein the first housing includes a first side frame and a rear cover, and the second housing includes a second side frame, and
    wherein the electronic device comprises a hinge module including a hinge combining the first housing and the second housing with each other.

3. The electronic device of claim 2, wherein the first grip sensor is spaced apart from the first side frame, and is disposed on at least a part of the rear cover, and
    the second grip sensor is disposed on at least a part of the second side frame.

4. The electronic device of claim 1, further comprising a hall sensor,
    wherein the hall sensor is configured to sense a change in a strength of a magnetic field, being changed depending on an operation in which the first housing and the second housing get closer to each other and farther away from each other, the hall sensor being further configured to convert the sensed change in magnetic field strength to an electrical signal and to transfer the electrical signal to the processor, and wherein the processor is configured to determine the folded state or the unfolded state of the electronic device based on the signal transferred from the hall sensor.

5. The electronic device of claim 1, wherein the processor is configured to:

activate a capacitance sensing operation using the first grip sensor and deactivate a capacitance sensing operation using the second grip sensor based on the electronic device being determined to be in the folded state, and sense the proximity and/or contact of the human body by comparing a capacitance sensed through the first grip sensor with a specified capacitance in case that the first grip sensor is activated.

6. The electronic device of claim 5, wherein the processor is configured to:

determine that there is the proximity of the human body based on the capacitance sensed through the first grip sensor being equal to or greater than the specified capacitance, and control the radiated power of the electronic device and/or the power of the electronic device based on determining that there is the proximity of the human body.

7. The electronic device of claim 1, wherein the processor is configured to:

activate a capacitance sensing operation using the second grip sensor and deactivate a capacitance sensing operation using the first grip sensor based on the electronic device being determined to be in the unfolded state, sense the proximity and/or contact of the human body by comparing a capacitance sensed through the second grip sensor with a specified capacitance based on the second grip sensor being activated, determine that there is the proximity of the human body based on the capacitance sensed through the second grip sensor being equal to or greater than the specified capacitance, and control the radiated power of the electronic device and/or the power of the electronic device based on determining that there is the proximity of the human body.

8. A method for controlling a power of an electronic device including a first housing and a second housing facing each other and combined with each other and configured to be folded or unfolded, the first housing including a first grip sensor, and the second housing including a second grip sensor, the method comprising:

determining a folded state or an unfolded state of the electronic device;

sensing proximity and/or contact of a human body using the second grip sensor and adjusting a radiated power of the electronic device and/or a power of the electronic device based on the sensed proximity and/or contact of the human body based on the electronic device being determined to be in the unfolded state; and sensing the proximity and/or contact of the human body using the first grip sensor and adjusting the radiated power of the electronic device and/or the power of the electronic device based on the sensed proximity and/or contact of the human body based on the electronic device being determined to be in the folded state.

9. The method of claim 8, wherein the first housing includes a first side frame and a rear cover, and the second housing includes a second side frame, and wherein the electronic device comprises a hinge module comprising a hinge combining the first housing and the second housing with each other.

10. The method of claim 9, wherein the first grip sensor is spaced apart from the first side frame, and is disposed on at least a part of the rear cover, and the second grip sensor is disposed on at least a part of the second side frame.

11. The method of claim 8, wherein the electronic device further includes a hall sensor, and wherein the method comprises:

sensing a change in strength of a magnetic field, depending on an operation in which the first housing and the second housing get closer to each other and farther away from each other, converting the sensed change in magnetic field strength to an electrical signal and transferring the electrical signal to the processor; and determining the folded state or the unfolded state of the electronic device based on the signal transferred from the hall sensor.

12. The method of claim 8, comprising:

activating a capacitance sensing operation using the first grip sensor and deactivating a capacitance sensing operation using the second grip sensor based on the electronic device being determined to be in the folded state; and sensing the proximity and/or contact of the human body by comparing a capacitance sensed through the first grip sensor with a specified capacitance based on the first grip sensor being activated.

13. The method of claim 12, further comprising:

determining that there is the proximity of the human body based on the capacitance sensed through the first grip sensor being equal to or greater than the specified capacitance.

14. The method of claim 13, further comprising:

controlling the radiated power of the electronic device and/or the power of the electronic device based on determining that there is the proximity of the human body.

15. The method of claim 8, comprising:

activating a capacitance sensing operation using the second grip sensor and deactivating a capacitance sensing operation using the first grip sensor based on the electronic device being determined to be in the unfolded state;

sensing the proximity and/or contact of the human body by comparing a capacitance sensed through the second grip sensor with a specified capacitance based on the second grip sensor being activated;

determining that there is the proximity of the human based on the capacitance sensed through the second grip sensor being equal to or greater than the specified capacitance; and controlling the radiated power of the electronic device and/or the power of the electronic device based on determining that there is the proximity of the human body.

* * * * *